(12) United States Patent
Hsueh

(10) Patent No.: US 11,917,758 B2
(45) Date of Patent: Feb. 27, 2024

(54) SUBSTRATE STRUCTURE AND MANUFACTURING METHOD THEREOF, ELECTRONIC DEVICE

(71) Applicant: PANELSEMI CORPORATION, New Taipei (TW)

(72) Inventor: Ya-Che Hsueh, Tainan (TW)

(73) Assignee: PANELSEMI CORPORATION, New Taipei (TW)

( * ) Notice: Subject to any disclaimer, the term of this patent is extended or adjusted under 35 U.S.C. 154(b) by 162 days.

(21) Appl. No.: 17/559,219

(22) Filed: Dec. 22, 2021

(65) Prior Publication Data

US 2022/0210916 A1    Jun. 30, 2022

(30) Foreign Application Priority Data

Dec. 28, 2020   (TW) ................................ 109146550

(51) Int. Cl.
| | |
|---|---|
| *H05K 1/11* | (2006.01) |
| *H01L 25/075* | (2006.01) |
| *H05K 3/40* | (2006.01) |
| *H05K 3/34* | (2006.01) |
| *H05K 1/18* | (2006.01) |
| *H01L 33/62* | (2010.01) |

(52) U.S. Cl.
CPC .......... *H05K 1/116* (2013.01); *H01L 25/0753* (2013.01); *H05K 3/3447* (2013.01); *H05K 3/4046* (2013.01); *H01L 33/62* (2013.01); *H05K 1/18* (2013.01); *H05K 2201/09672* (2013.01); *H05K 2201/10106* (2013.01); *H05K 2201/10287* (2013.01); *H05K 2203/0156* (2013.01)

(58) Field of Classification Search
CPC ........ H05K 1/115; H05K 1/116; H05K 1/113; H05K 1/114
See application file for complete search history.

(56) References Cited

U.S. PATENT DOCUMENTS

| | | | |
|---|---|---|---|
| 3,230,297 A * | 1/1966 | Means ................. | H05K 3/4046 174/262 |
| 2015/0011131 A1 * | 1/2015 | Zhou .................... | H01R 13/518 439/694 |

* cited by examiner

*Primary Examiner* — Jeremy C Norris
(74) *Attorney, Agent, or Firm* — Muncy, Geissler, Olds & Lowe, P.C.

(57) ABSTRACT

A substrate structure, a manufacturing method thereof, and an electronic device. The substrate structure includes a substrate, conductive wires and conductive members. Multiple through holes penetrate through the substrate body of the substrate. Multiple first conductive pads are arranged on the first surface of the substrate body. Multiple second conductive pads are arranged on the second surface of the substrate body. The conductive wires are accommodated in the through holes and each has a first end in the first opening of corresponding through hole and a second end in the second opening of corresponding through hole. The conductive members are distributed on the first and second surfaces, and both ends thereof are connected to the corresponding first and second conductive pads through the conductive members. At least part of each conductive wire does not contact the hole wall of each through hole in a direct manner.

21 Claims, 10 Drawing Sheets

SUBSTRATE STRUCTURE AND MANUFACTURING METHOD THEREOF, ELECTRONIC DEVICE

CROSS REFERENCE TO RELATED APPLICATIONS

This Non-provisional application claims priority under 35 U.S.C. § 119(a) on Patent Application No(s). 109146550 filed in Taiwan, Republic of China on Dec. 28, 2020, the entire contents of which are hereby incorporated by reference.

BACKGROUND

Technology Field

The present disclosure relates to a substrate structure and, in particular, to a substrate structure and a manufacturing method thereof, and an electronic device containing the substrate structure.

Description of Related Art

Regarding the manufacturing process of electronic devices, especially photoelectric devices, in order to electrically connect the circuit layer formed on the upper surface of the substrate and the circuit layer formed on the lower surface of the substrate, the conventional method is to drill holes through the substrate first, and then to form a conductive film in the hole by chemical plating or/and electroplating process. Accordingly, the conductive film formed in the holes can connect to the circuit layers formed on the upper and lower surfaces respectively, thereby achieving the purpose of electrically connecting the circuit layers on the upper and lower surfaces of the substrate.

However, the chemical plating or electroplating process used in the conventional manufacturing method is complex and expensive. Moreover, the electroplating solution used in the conventional manufacturing method also has the problem of environmental pollution.

SUMMARY

This disclosure provides a substrate structure, a manufacturing method of the substrate structure, and an electronic device containing the substrate structure. The disclosure has some advantages, other than the conventional chemical plating or electroplating process, such as simplified manufacturing process, lower manufacturing cost, and environmentally friendly.

One or more exemplary embodiments of this present disclosure provide a substrate structure, which includes a substrate, a plurality of conductive wires, and a plurality of conductive members. The substrate has a substrate body, a plurality of through holes, a plurality of first conductive pads, and a plurality of second conductive pads. The substrate body is defined with a first surface and a second surface opposite to the first surface. The through holes penetrate through the substrate body, and each through hole is defined with a first opening, a second opening, and a hole wall. The first conductive pads are distributed on the first surface of the substrate body and adjacent to the first openings of the through holes, and the second conductive pads are distributed on the second surface of the substrate body and adjacent to the second openings of the through holes. The conductive wires are arranged in the through holes, and each conductive wire extends from the first opening to the second opening of the corresponding through hole. Each conductive wire is defined with a first end and a second end, wherein the first end of the conductive wire is located at the first opening of the corresponding through hole, and the second end of the conductive wire is located at the second opening of the corresponding through hole. The conductive members are distributed on the first surface and the second surface of the substrate body. The first end of each conductive wire is electrically connected to the corresponding first conductive pad through one of the conductive members, and the second end of each conductive wire is electrically connected to the corresponding second conductive pad through one of the conductive members. At least one part of each conductive wire does not contact the hole wall of the corresponding through hole in a direct manner.

In one exemplary embodiment, the at least one part of each conductive wire does not contact the corresponding conductive member in a direct manner.

In one exemplary embodiment, the substrate structure further comprises a plurality of organic materials, each through hole is defined with a gap between the hole wall and the corresponding conductive wire, each of the organic materials is filled in each of the gaps, and each of the organic materials connects the corresponding conductive wire and the corresponding hole wall.

In one exemplary embodiment, the substrate structure is further defined with a plurality of concave spaces. Two ends of each organic material approach the first opening and the second opening of the corresponding through hole, one end of each organic material, the corresponding hole wall, and one of the corresponding first opening and the corresponding second opening together form the corresponding concave space, and at least one part of each conductive member is located in the corresponding concave space.

In one exemplary embodiment, the substrate structure is further defined with a plurality of concave spaces. The concave spaces are defined between the hole walls and the corresponding first openings and between the hole walls and the corresponding second openings. At least one part of each conductive member is located in the corresponding concave space.

In one exemplary embodiment, the first end of each conductive wire is electrically connected to the corresponding first conductive pad through one of the conductive members, and the second end of each conductive wire is electrically connected to the corresponding second conductive pad through another one of the conductive members.

In one exemplary embodiment, at least one of the conductive members extends from the first end to the second end of the corresponding conductive wire.

In one exemplary embodiment, each of the conductive members covers at least one part of the first opening and the second opening of the corresponding through hole.

In one exemplary embodiment, each through hole is defined with a depth-to-diameter ratio, and a value of the depth-to-diameter ratio is greater than or equal to 0.1 and is less than or equal to 75.

In one exemplary embodiment, the substrate body is defined with a thickness, and the thickness is greater than or equal to 0.01 mm and is less than or equal to 1.1 mm.

In one exemplary embodiment, each through hole is defined with a diameter, and the diameter of the through hole is greater than or equal to 0.015 mm.

In one exemplary embodiment, each conductive wire is defined with a diameter, and the diameter of the conductive wire is greater than or equal to 0.01 mm.

In one exemplary embodiment, each conductive wire is defined with a diameter, and the diameter of the conductive wire is greater than or equal to 0.005 mm In one exemplary embodiment, the substrate body is a rigid substrate, a resilient substrate, or a combination of at least one rigid substrate and at least one resilient substrate.

In one exemplary embodiment, the substrate body is configured with a conductive pattern layer, at least one of the through holes penetrates through the conductive pattern layer, and the conductive pattern layer is electrically connected to one of the conductive members.

In one exemplary embodiment, the substrate body comprises a plurality of base layers, and the conductive pattern layer is arranged between two of the base layers. In two of the base layers, a diameter of a hole of one of the base layers adjacent to the first opening is greater than a diameter of a hole of the other one of the base layers away from the first opening, thereby exposing the conductive pattern layer.

In one exemplary embodiment, the substrate body comprises a glass material, a polyimide material, or a combination thereof.

In one exemplary embodiment, the material of each conductive wire comprises gold, copper, or aluminum, or any alloy thereof.

In one exemplary embodiment, the material of each conductive member comprises gold, tin, copper, or aluminum, or silver, or an alloy made of any combination thereof.

In one exemplary embodiment, the first end of one of the conductive members is eutectic bonding to the corresponding first conductive pad, or/and the second end of one of the conductive members is eutectic bonding to the corresponding second conductive pad.

In one exemplary embodiment, the substrate further comprises a first conductive circuit, and the first conductive circuit is distributed on the first surface of the substrate body and electrically connected to the first conductive pads.

In one exemplary embodiment, the substrate further comprises a second conductive circuit, and the second conductive circuit is distributed on the second surface of the substrate body and electrically connected to the second conductive pads.

One or more exemplary embodiments of this present disclosure provide an electronic device, which comprises the above-mentioned substrate structure, and a plurality of electric structures distributed on the first surface of the substrate body. The electric structures are electrically connected to the first conductive pads, and further electrically connected to the second conductive pads via the conductive wires.

In one exemplary embodiment, the electric structures comprise a plurality of photoelectric elements.

One or more exemplary embodiments of this present disclosure provide a manufacturing method of a substrate structure, which at least comprises the following steps of: preparing a substrate, wherein the substrate comprises a rigid substrate, a resilient substrate, a plurality of through holes, and a plurality of first conductive pads, the rigid substrate is defined with a first surface and a second surface, the first conductive pads are distributed on the first surface of the rigid substrate, the through holes penetrate through the rigid substrate, and the resilient substrate is arranged on the second surface of the rigid substrate and covers one opening of each of the through holes; placing a plurality of conductive wires in the through holes, wherein each of the conductive wires is defined with a first end and a second end, the second end of each conductive wire contacts the resilient substrate, the first end of each conductive wire is adjacent to the other opening of the corresponding through hole, and at least one part of each conductive wire does not contact the hole wall of the corresponding through hole in a direct manner; and forming a plurality of conductive members on the first ends of the conductive wires and curing the conductive members, so that the conductive members electrically connect the first ends of the conductive wires to the first conductive pads in a respective manner.

In one exemplary embodiment, before or after the step of placing a plurality of conductive wires in the through holes, the manufacturing method further comprises: forming a first conductive circuit on the first surface of the rigid substrate, wherein the first conductive pads are electrically connected to the first conductive circuit.

In one exemplary embodiment, in the step of forming a plurality of conductive members, the manufacturing method further comprises: forming the first conductive circuit at the same time.

In one exemplary embodiment, after the step of placing a plurality of conductive wires in the through holes, the manufacturing method further comprises: removing the resilient substrate to expose the openings of the through holes; and forming a plurality of second conductive pads on the second surface of the rigid substrate, wherein the second conductive pads are adjacent to the openings of the through holes.

In one exemplary embodiment, the resilient substrate comprises an adhesive layer, and the adhesive layer attaches to the second surface of the rigid substrate.

In one exemplary embodiment, before or after the step of placing a plurality of conductive wires in the through holes, the manufacturing method further comprises: forming a second conductive circuit on the second surface of the rigid substrate, wherein the second conductive pads are electrically connected to the second conductive circuit.

In one exemplary embodiment, in the step of forming a plurality of conductive members, the manufacturing method further comprises: forming the second conductive circuit at the same time.

In one exemplary embodiment, before or after the step of placing a plurality of conductive wires in the through holes, the manufacturing method further comprises: forming a plurality of second conductive pads on a surface of the resilient substrate away from the rigid substrate.

In one exemplary embodiment, before or after the step of placing a plurality of conductive wires in the through holes, the manufacturing method further comprises: forming a second conductive circuit on the surface of the resilient substrate away from the rigid substrate, wherein the second conductive pads are electrically connected to the second conductive circuit.

In one exemplary embodiment, after the step of placing a plurality of conductive wires in the through holes, the manufacturing method further comprises: forming a plurality of outer holes on the resilient substrate, wherein the outer holes communicate with the through holes of the rigid substrate, and the second conductive pads are adjacent to the outer holes of the through holes.

In one exemplary embodiment, in the step of preparing a substrate, the substrate further comprises an additional resilient substrate arranged on the first surface of the rigid substrate, and the two resilient substrates cover two openings of each through hole; and the manufacturing method further comprises: forming a plurality of first outer holes on the resilient substrate arranged on the first surface of the rigid substrate and forming a plurality of first conductive pads on this resilient substrate, wherein each of the first outer holes communicate with the corresponding through hole, and the first conductive pads correspond to the first outer holes.

In one exemplary embodiment, before or after the step of placing a plurality of conductive wires in the through holes, the manufacturing method further comprises: forming a first conductive circuit on the resilient substrate arranged on the first surface of the rigid substrate, wherein the first conductive pads are electrically connected to the first conductive circuit.

In one exemplary embodiment, before or after the step of placing a plurality of conductive wires in the through holes, the manufacturing method further comprises: forming a plurality of second conductive pads on the resilient substrate arranged on the second surface of the rigid substrate.

In one exemplary embodiment, before or after the step of placing a plurality of conductive wires in the through holes, the manufacturing method further comprises: forming a second conductive circuit on a surface of the resilient substrate away from the rigid substrate, wherein the second conductive pads are electrically connected to the second conductive circuit.

In one exemplary embodiment, in the step of forming a plurality of conductive members, the manufacturing method further comprises: forming a plurality of second outer holes on the resilient substrate arranged on the second surface of the rigid substrate and forming a plurality of second conductive pads on this resilient substrate, wherein each of the second outer holes communicates with the corresponding through hole, and the second conductive pads correspond to the second outer holes.

In one exemplary embodiment, before the step of forming a plurality of conductive members, the manufacturing method further comprises: filling a plurality of organic materials in the through holes.

In one exemplary embodiment, the step of filling the organic materials is performed after the step of placing the conductive wires.

In one exemplary embodiment, the organic materials are fluid.

In one exemplary embodiment, after the step of placing a plurality of conductive wires in the through holes, the manufacturing method further comprises: repeating the step of forming a plurality of conductive members to form additional conductive members on the second ends of the conductive wires and solidify the additional conductive members, so that the additional conductive members electrically connect the second ends of the conductive wires to the second conductive pads in a respective manner.

In one exemplary embodiment, before repeating the step of forming a plurality of conductive members, the manufacturing method further comprises: repeating the step of filling the organic materials to fill additional organic materials in the through holes.

In one exemplary embodiment, the viscosity of the additional organic materials is lower than the viscosity of the previously filled organic materials.

In one exemplary embodiment, when repeating the step of forming a plurality of conductive members, the manufacturing method further comprises: forming the second conductive circuit at the same time.

In one exemplary embodiment, in the step of forming a plurality of conductive members, at least one conductive member extends from the first end to the second end of the corresponding conductive wire, connects to the corresponding first conductive pad at the first end of the conductive wire, and connects to the corresponding second conductive pad at the second end of the conductive wire, and at least one part of at least one conductive member does not contact the hole wall of the corresponding through hole in a direct manner.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
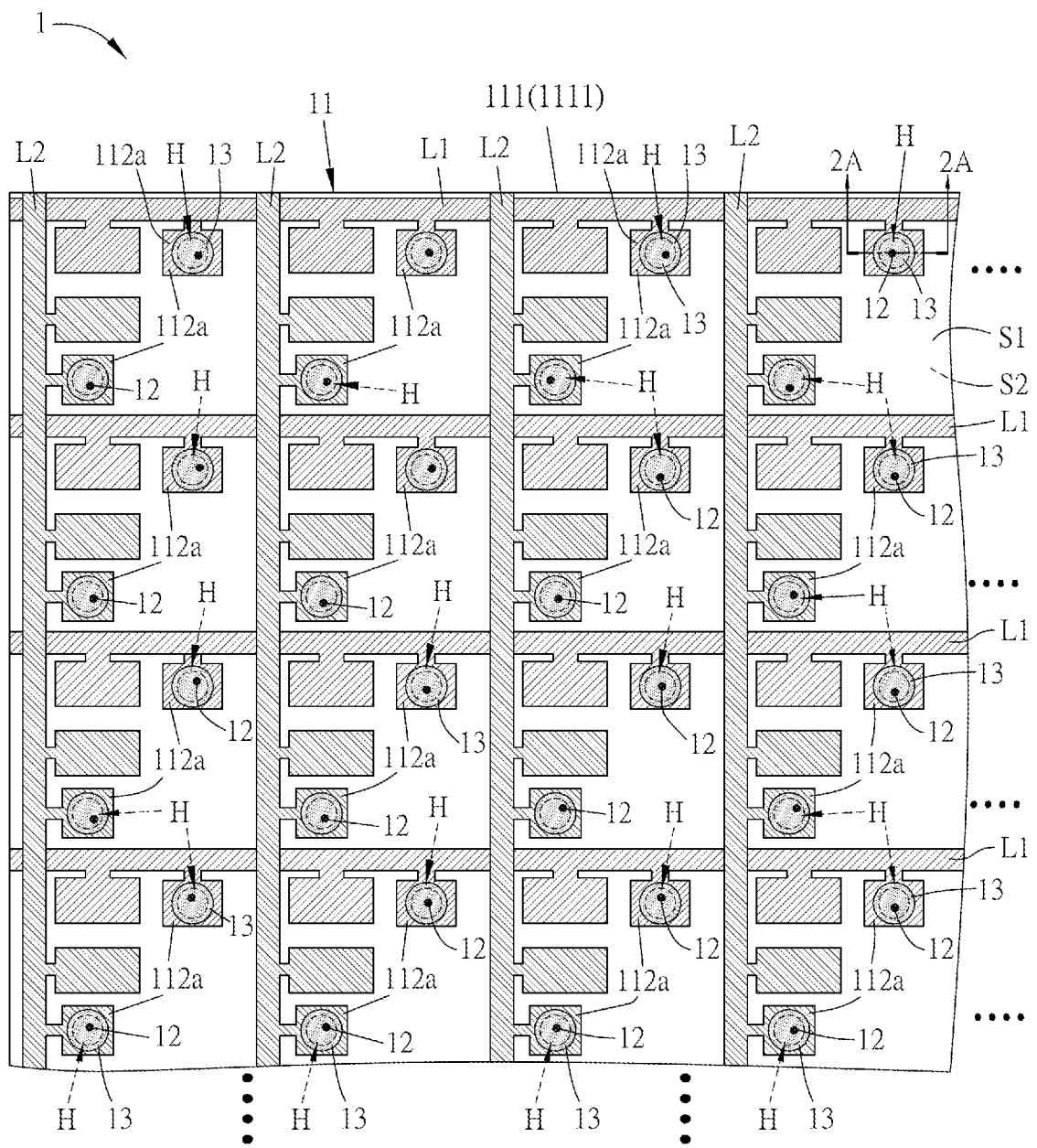
FIG. 1 is a schematic diagram showing a substrate structure according to an embodiment of this disclosure.
Figure 2A:
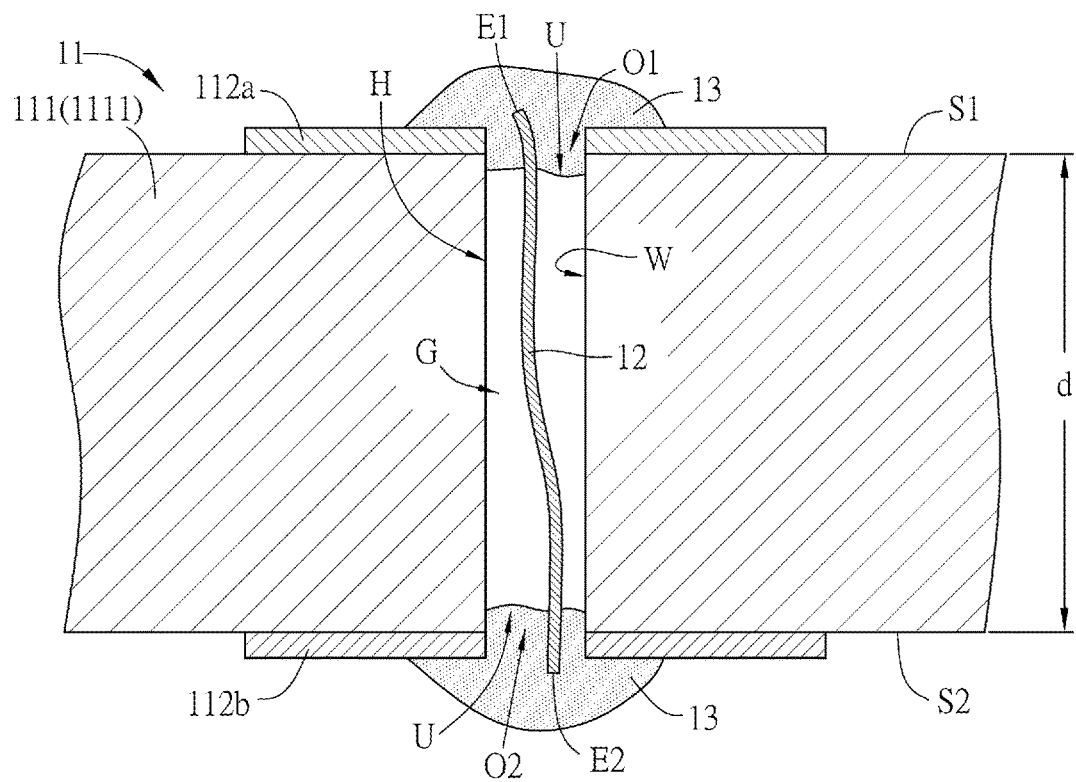
FIGS. 2A to 2C are sectional views of different aspects of the substrate structure as shown in FIG. 1 along the line 2A-2A.
Figure 2B:
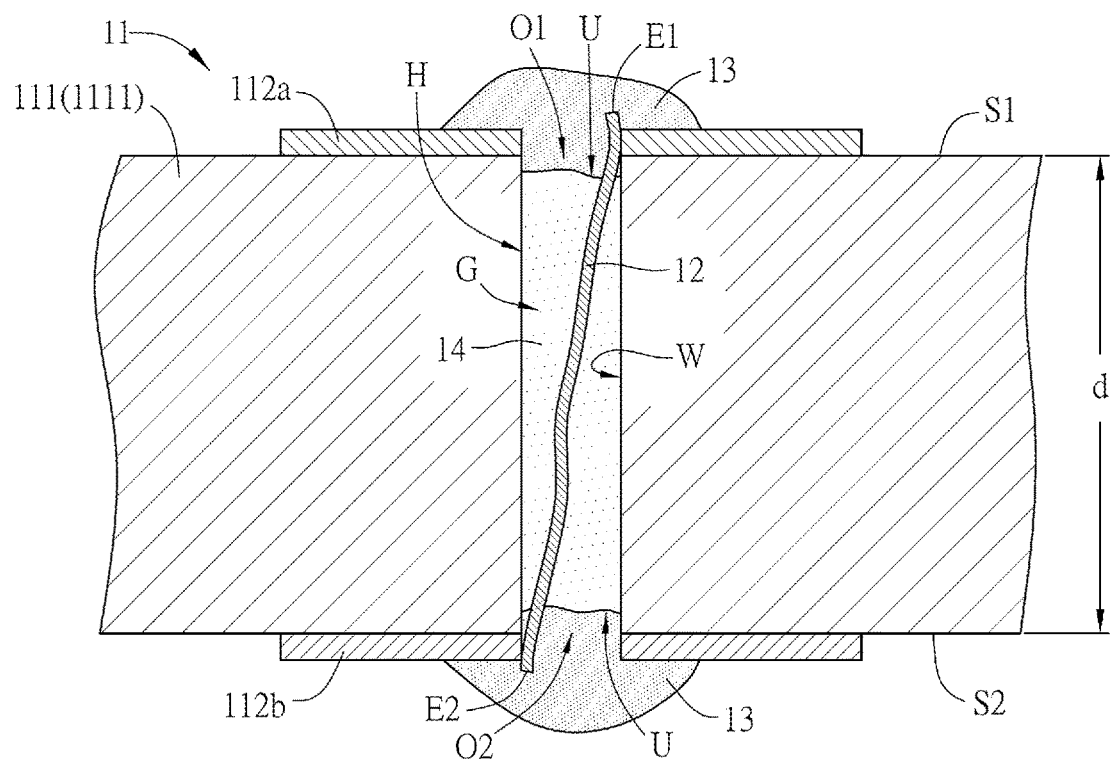
Figure 2C:
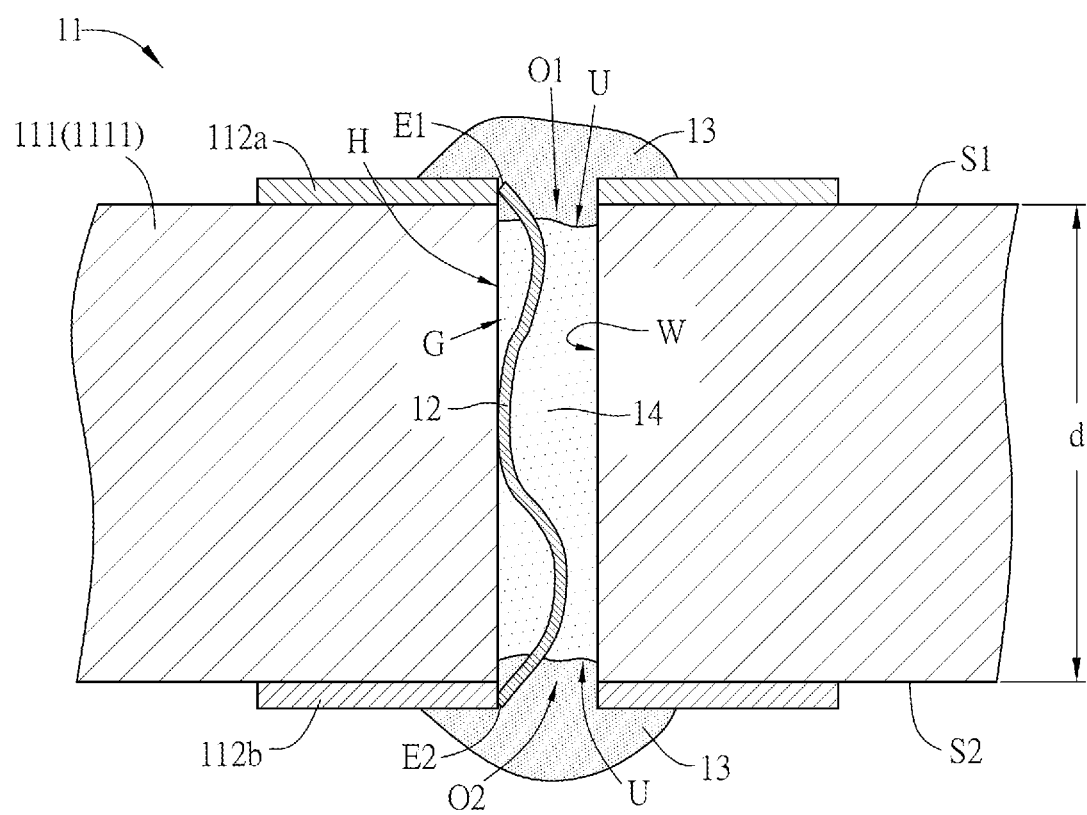

FIG. 1 is a schematic diagram showing a substrate structure according to an embodiment of this disclosure, and FIGS. 2A to 2C are sectional views of different aspects of the substrate structure as shown in FIG. 1 along the line 2A-2A. As shown in FIG. 1, the substrate structure of this embodiment is, for example, an active matrix (AM) substrate structure, but this disclosure is not limited thereto. In other embodiments, the substrate structure can be a passive matrix (PM) substrate structure, or any of other types of substrate structures.

Referring to FIGS. 1 and 2A to 2C, the substrate structure 1 comprises a substrate 11, a plurality of conductive wires 12, and a plurality of conductive members 13.

The substrate 11 comprises a substrate body 111, a plurality of through holes H, a plurality of first conductive pads 112a, and a plurality of second conductive pads 112b. Moreover, in some embodiments, the substrate 11 further comprises a first conductive circuit (e.g. a plurality of signal lines L1 and L2), and a second conductive circuit (not shown).

The substrate body 111 is defined with a first surface S1 (e.g. the upper surface) and a second surface S2 (e.g. the lower surface) opposite to the first surface S1. The first conductive circuit is distributed on the first surface S1 of the substrate body 111, and the second conductive circuit is distributed on the second surface S2 of the substrate body 111. As shown in FIG. 1, the first conductive circuit of this embodiment comprises, for example, a plurality of signal lines L1 and a plurality of data lines L2. The signal lines L1 are laterally arranged on the first surface S1 of the substrate 11 and are substantially in parallel, and the data lines L2 are arranged on the first surface S1 of the substrate 11 in the elongation direction and are substantially in parallel. The signal lines L1 are perpendicular to and interlaced with the data lines L2. In some embodiments, the signal lines L1 and the data lines L2 can be the conductive circuits for transmitting electric signals (e.g. scan circuit or/and data circuit), and the configuration thereof depends on the function and application of the electronic device. In some embodiments, the second conductive circuit (not shown) can also comprise a plurality of conductive lines or signal lines.

The substrate 11 can be a rigid substrate, a resilient substrate, a semi-rigid substrate, or a composite structure of the rigid substrate and resilient substrate. In some cases, the semi-rigid substrate could be elaborated as the resilient substrate, or one of the composite substrates. For example, the substrate 11 can be a glass substrate, a metal substrate, a ceramic substrate, a PI (polyimide) substrate, or a substrate made of a composite material containing any of the above-mentioned materials. To be understood, when the thickness of the resilient substrate increases, the physical properties thereof can approach that of the rigid substrate. The substrate body 111 can comprise a glass material, a PI material, or the combination thereof. Besides, the substrate body 11 can be a rigid substrate, a resilient substrate, a semi-rigid substrate, or a combination of a rigid substrate and a resilient substrate. The resilient substrate can comprise a PI material, an adhesive layer, or a combination thereof. In this embodiment, the substrate body 111 is a rigid substrate (herein, a rigid substrate 1111) and comprises a glass material, so that the substrate body 111 is a rigid glass substrate body. As shown in FIG. 2A, the substrate body 111 (or the rigid substrate 1111) is defined with a thickness d, which is greater than or equal to 0.01 mm and is less than or equal to 1.1 mm (0.01 mm≤d≤1.1 mm). For example, the thickness d can optionally be 10 µm, 20 µm, 30 µm, 100 µm, 400 µm, 500 µm, or 700 µm. The substrate body 111 (or the rigid substrate 1111) usually has a uniform thickness d, but this disclosure is not limited thereto. If the thickness d of the substrate body 111 (or the rigid substrate 1111) is not uniform, the value of the thickness d is defined to be equal to the minimum thickness of the substrate body 111 (or the rigid substrate 1111). In addition, the material of the first conductive circuit or/and the second conductive circuit can be, for example, gold, copper, aluminum, the alloy of any combination thereof, or any of other conductive materials.

The through holes H penetrate through the substrate body 111 and connect to the first surface S1 and the second surface S2 of the substrate body 111. The through holes H are adjacent to the signal lines L1 and L2. As shown in FIGS. 2A to 2C, each through hole H is defined with a first opening O1, a second opening O2 opposite to the first opening O1, and a hole wall W. The first conductive pads 112a are distributed on the first surface S1 of the substrate body 111, adjacent to the first openings O1 of the through holes H, and electrically connected to the first conductive circuit (i.e., the signal lines L1 or the signal lines L2 as shown in FIG. 1). The second conductive pads 112b are distributed on the second surface S2 of the substrate body 111, adjacent to the second openings O2 of the through holes H, and electrically connected to the second conductive circuit.

In some embodiments, the dimensions of the first openings O1 and the second openings O2 can be the same or different. Each through hole H is defined with a diameter, such as a minimum diameter, which is greater than or equal to 15 µm. For example, the diameter of each through hole H can optionally be 15 µm, 20 µm, 30 µm, 50 µm, 100 µm, or the like. Herein, the through hole H can have a uniform diameter (i.e., the through hole H has one diameter value); or the diameter of the through hole H is not uniform (e.g. the through hole H has a narrower middle portion and wider top and bottom portions, or the through hole H is gradually wider from bottom to top or from top to bottom). In addition, each through hole H can be further defined with a depth-to-diameter ratio (the ratio of the depth of the through hole H to the diameter of the through hole H). Herein, the depth of each through hole H can be realized as the thickness d of the substrate body 111. For example, when the substrate body 111 has a uniform thickness, the depths of all through holes H are equal to the thickness d of the substrate body 111. Otherwise, when the substrate body 111 does not have a uniform thickness, the depths of all through holes H are different values. In one aspect, optionally, the depth-to-diameter ratio is greater than or equal to 0.1 and is less than or equal to 75 (0.1≤depth-to-diameter ratio≤75). For example, the depth-to-diameter ratio of each through hole H can optionally be 0.1 (e.g. 50 µm/500 µm), 0.67 (e.g. 10 µm/15 µm), 1.33 (e.g. 20 µm/15 µm), 6.67 (e.g. 100 µm/15 µm), 25 (e.g. 500 µm/20 µm), 33.33 (e.g. 500 µm/15 µm), 35 (e.g. 700 µm/20 µm), 46.67 (e.g. 700 µm/15 µm), 73.33 (e.g. 1100 µm/15 µm), or the like.

A plurality of conductive wires 12 are arranged in the through holes H, and each conductive wire 12 extends from the first opening O1 to the second opening O2 of the corresponding through hole H. Each conductive wire 12 is defined with a first end E1 and a second end E2. The first end E1 of the conductive wire 12 is located at the first opening O1 of the corresponding through hole H, and the second end E2 of the conductive wire 12 is located at the second opening O2 of the corresponding through hole H. In some embodiments, one through hole H can accommodate at least one conductive wire 12. In some embodiments, at least a part of the through holes H accommodate the conductive wires 12. In this embodiment, the through holes H all accommodate the conductive wires 12, and each through hole H accommodates at least one conductive wire 12.

In some embodiments, as shown in FIGS. 2A and 2B, the conductive wire 12 does not contact the hole wall W of the corresponding through hole H in a direct manner, but this disclosure is not limited thereto. In other embodiments, as shown in FIG. 2C, the conductive wire 12 directly contacts the hole wall W of the corresponding through hole H. In some embodiments, the material of each conductive wire 12 can be a metal wire, such as gold, copper, aluminum, or any combination thereof, or any alloy thereof. Each conductive wire 12 is defined with a diameter, which is greater than or equal to 0.01 mm. In this embodiment, the diameter of the conductive wire 12 is the maximum diameter thereof, such as 50 µm, 1 mil (about 25 µm, the material is, for example, copper or gold), 15 µm (the material is, for example, copper), or 10 µm (the material is, for example, gold). In some embodiments, the diameter of the conductive wire 12 can be greater than or equal to 0.005 µm. To be understood, it is to be considered that the conductive wire 12 should be accommodated in the corresponding through hole H (i.e., the diameter of the conductive wire 12 must be less than the diameter of the corresponding through hole H).

A plurality of conductive members 13 are distributed on the first surface S1 and the second surface S2 of the substrate body 111. The conductive members 13 can cover at least one part of the first openings O1 and the second openings O2 of the through holes H. In some embodiments, the conductive members 13 can partially or entirely cover the first openings O1 or/and the second openings O2. In the embodiment as shown in FIGS. 2A to 2C, the first opening O1 of the through hole H is entirely covered by one conductive member 13, and the second opening O1 of the through hole H is entirely covered by another conductive member 13. In addition, one part of the conductive members 13 electrically connect the first ends E1 of the conductive wires 12 to the first conductive pads 112a, and the other part of the conductive members 13 electrically connect the second ends E2 of the conductive wires 12 to the second conductive pads 112b. In other words, in order to electrically connect the first conductive circuit (including the signal lines L1 and L2) on the first surface S1 of the substrate body 111 to the second conductive circuit on the second surface S2 of the substrate body 111 via the through holes H, in the substrate structure 1 of this embodiment, at least one conductive wire 12 is placed in the through hole H, and the conductive members 13 cover at least one part of the first openings O1 and the second openings O2 of the through holes H. Accordingly, two ends (E1 and E2) of each conductive wire 12 can be electrically connected to the first conductive pad 112a and the second conductive pad 112b, respectively, via the corresponding conductive members 13, thereby electrically connecting the first conductive pads 112a on the first surface S1 of the substrate body 111 to the second conductive pads 112b on the second surface S2 of the substrate body 111 via the conductive members 13 and the conductive wires 12 in the through holes H to form a circuit. To be understood, the first conductive circuit (including the signal lines L1 and L2) on the first surface S1 of the substrate body 111 can be electrically connected to the second conductive circuit on the second surface S2 of the substrate body 111 via the above-mentioned conductive structure. In some embodiments, at least a part of the first opening O1 and at least a part of the second opening O2 of the through hole H are covered by the same conductive member 13. For example, the conductive member 13 extends from the first end E1 to the second E2 of the conductive wire 12, the portion of the conductive member 13 located at the first opening O1 is electrically connected to the corresponding first conductive pad 112a, and the portion of the conductive member 13 located at the second opening O2 is electrically connected to the corresponding second conductive pad 112b.

In each through hole H, at least a part of the corresponding conductive wire 12 does not contact the hole wall W of the through hole H in a direct manner. Furthermore, at least a part of each conductive wire 12 does not contact the corresponding conductive member 13. In some embodiments, at least a part of each conductive wire 12 does not contact the hole wall W of the corresponding through hole H in a direct manner, and does not contact the corresponding conductive member 13. That is, a part of the conductive wire 12 located in the corresponding through hole H does not contact the hole wall W of the corresponding through hole H in a direct manner, and does not contact the corresponding conductive member 13 in a direct manner. In some embodiments, the material of each conductive member 13 can comprise, for example, gold, tin, copper, silver, or any combination thereof, or an alloy of their combinations (e.g. an alloy containing tin, bismuth, copper and silver), and this disclosure is not limited thereto. The conductive member 13 can be a fluid material (before solidification), such as solder paste or silver paste. In some embodiments, when the fluid material fills into the first opening O1 of the through hole H, a part of the fluid material (the conductive member 13) will flow along the corresponding conductive wire 12 from the first end E1 to the second end E2 of the corresponding conductive wire 12, so that the formed conductive member 13 can extend from the first end E1 to the second end E2 of the corresponding conductive wire 12. In this case, at least one part of each conductive wire 12 still does not contact the hole wall W of the corresponding through hole H in a direct manner.

Referring to FIGS. 2A to 2C, each through hole H is defined with a gap G between the hole wall W and the corresponding conductive wire 12. In some embodiments, as shown in FIGS. 2B and 2C, the substrate structure 1 further comprises a plurality of organic materials 14. Each of the organic materials 14 is filled (partially filled or fully filled) in the gap G in the corresponding through hole H, and each organic material 14 in each through hole H connects the corresponding conductive wire 12 and the corresponding hole wall W. In other words, each organic material 14 covers (surrounds) at least one part of the corresponding conductive wire 12, and each organic material 14 fully fills the gap G in the corresponding through hole H. In other aspects, each organic material 14 partially fills the gap G in the corresponding through hole H (e.g. some bubbles exist in the through hole H), and this disclosure is not limited thereto. To be noted, at least one part of each conductive wire 12 does not contact the hole wall W of the corresponding through hole H in a direct manner. Herein, at least one part of the conductive wire 12 may indirectly contact the hole wall W of the corresponding through hole H via the fully or partially filled organic material 14 in the through hole H. The above two conditions do not conflict in this embodiment.

In addition, the substrate structure 1 of this embodiment is further defined with a plurality of concave spaces U, and each concave space U can be configured between the corresponding hole wall W and where the corresponding first opening O1 is, or between the corresponding hole wall W and where the corresponding second opening O2 is. At least one part of each conductive member 13 is located in the corresponding concave space U. In the step of filling the organic materials 14, as shown in FIGS. 2B and 2C, two ends (the upper and lower ends) of each organic material 14 approach (very close to) the first opening O1 and the second opening O2 of the corresponding through hole H, respectively. One end of each organic material 14, the corresponding hole wall W, and one of the corresponding first opening O1 and the corresponding second opening O2 together form the corresponding concave space U, and at least one part of each conductive member 13, which is located in the first opening O1 or the second opening O2, can be arranged in the corresponding concave space U. In this embodiment, the concave space U is located at the first opening O1 or the second opening O2 and is sunk toward the middle part of the through hole H. The concave space U provides a space to receive a part of the corresponding conductive member 13, and the conductive member 13 in the concave space U can contact the hole wall W. In other words, during the manufacturing process of the substrate structure 1 of this disclosure, a part of the conductive member 13 can be filled into the first opening O1 or the second opening O2 as well as the corresponding concave space U in the through hole H. Accordingly, in the through hole H as shown in FIGS. 2B and 2C, the conductive member 13 not only covers the first opening O1 or the second opening O2, but also fills the corresponding concave space U. The residual space inside the through hole H other than the concave space U is partially or fully filled by the organic material 14.

Figure 3:
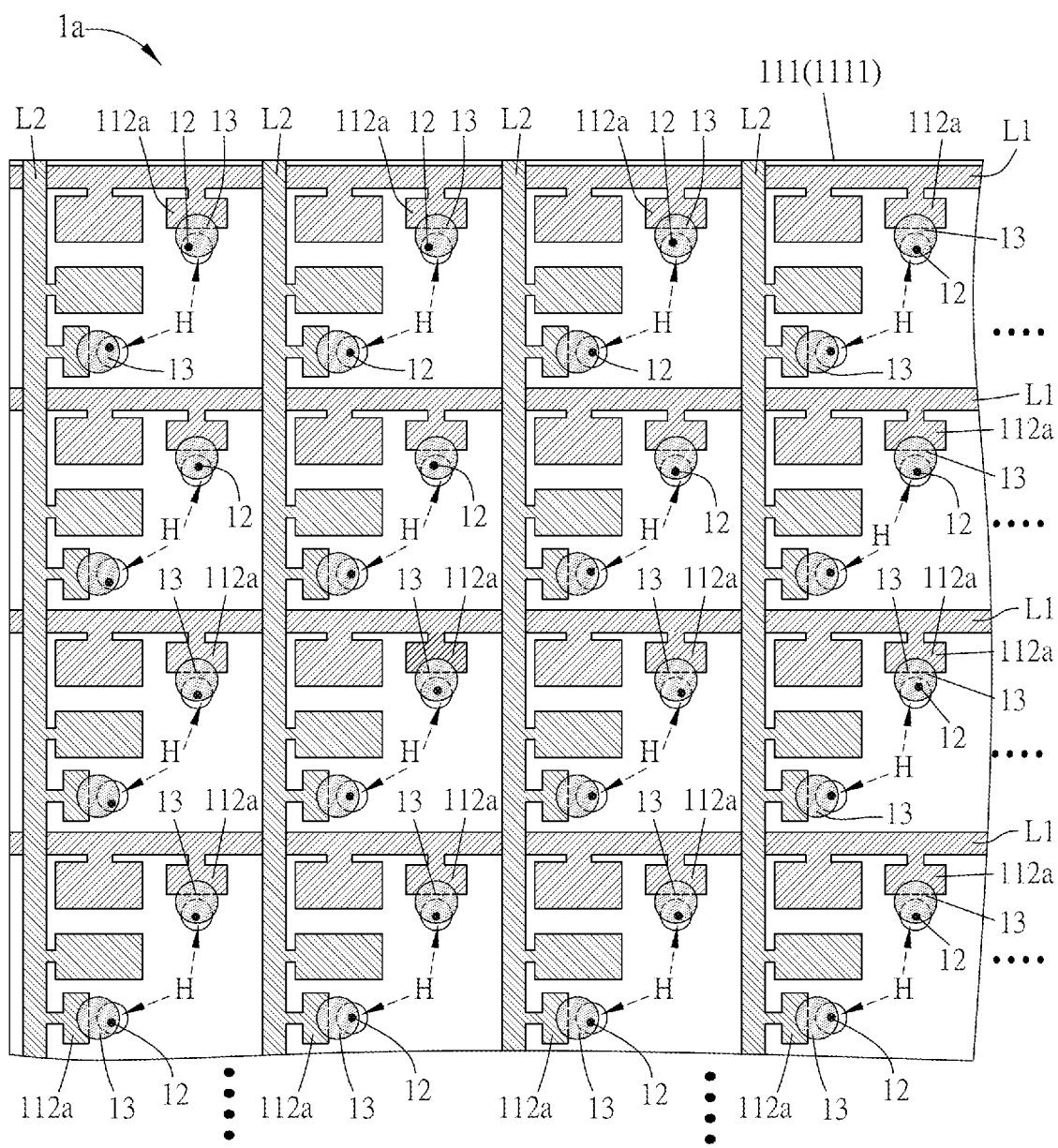
FIG. 3 is a schematic diagram showing a substrate structure according to another embodiment of this disclosure.

FIG. 3 is a schematic diagram showing a substrate structure 1a according to another embodiment of this disclosure. As shown in FIG. 3, the component configuration and connection of the substrate structure 1a of this embodiment are mostly the same as those of the substrate structure 1 of the above-mentioned embodiment. Unlike the substrate structure 1, in the substrate structure 1a of this embodiment, each through hole H is located beyond the edges of the corresponding first conductive pad 112a and the corresponding second conductive pad 112b. As shown in FIG. 3, the each through hole H is not overlapped with the corresponding first conductive pad 112a and the corresponding second conductive pad 112b. In addition, each conductive member 13 can partially cover the first opening O1 or the second opening O2 of the corresponding through hole H. Of course, in different embodiments, at least one of the through holes H is partially overlapped with the corresponding first conductive pad 112a or/and the corresponding second conductive pad 112b. In different embodiments, the conductive member 13 can cover the entire first opening O1 of the corresponding through hole H, but partially cover the second opening O2 of the corresponding through hole H. In different embodiments, the conductive member 13 can cover the entire second opening O2 of the corresponding through hole H, but partially cover the first opening O1 of the corresponding through hole H. This disclosure is not limited thereto.

Figure 4:
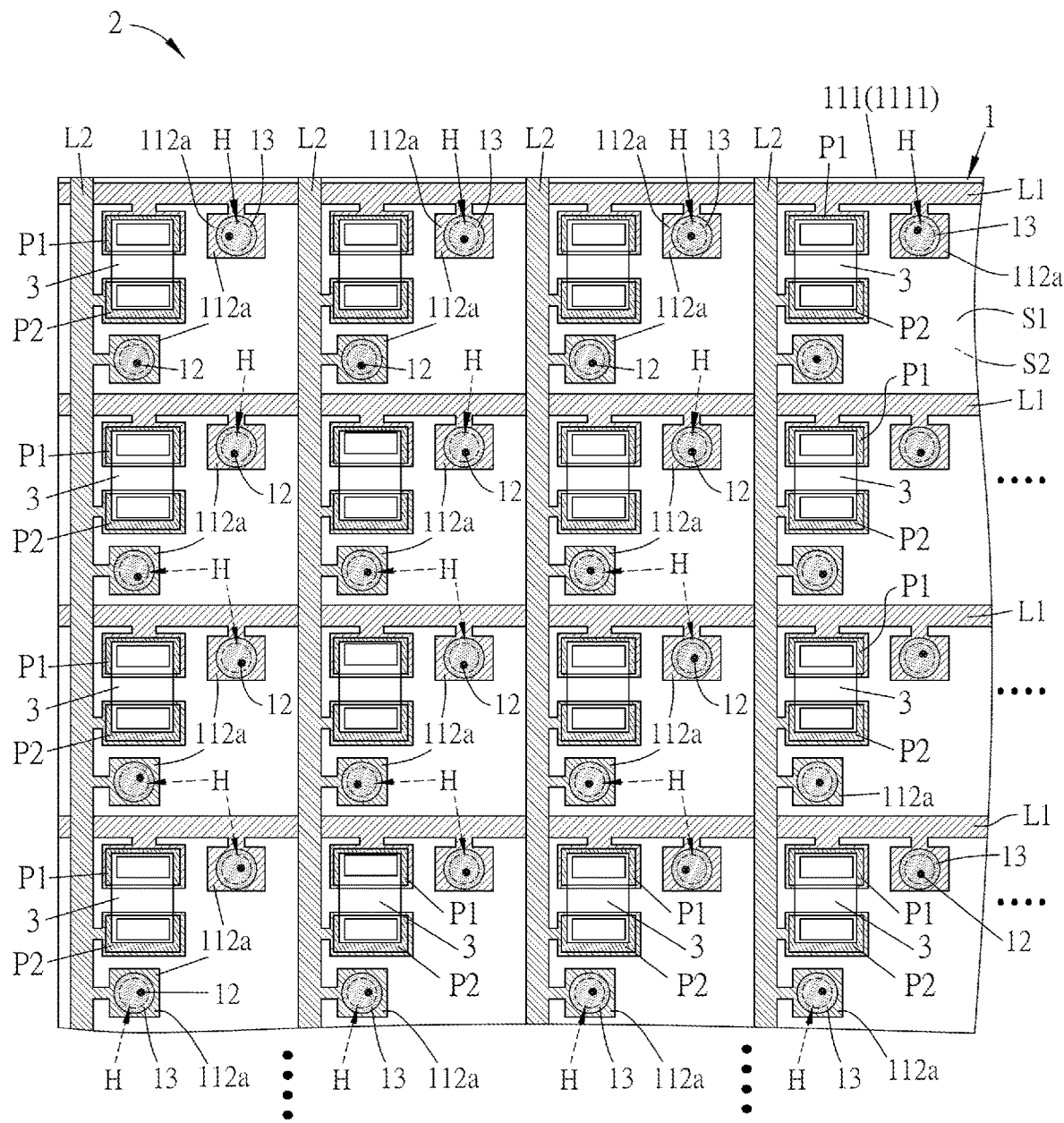
FIG. 4 is a schematic diagram showing an electronic device according to an embodiment of this disclosure.

FIG. 4 is a schematic diagram showing an electronic device 2 according to an embodiment of this disclosure. As shown in FIG. 4, the electronic device 2 comprises a substrate structure 1 and a plurality of electric structures 3. In this embodiment, the electronic device comprises the above-mentioned substrate structure 1, but this disclosure is not limited thereto. In different embodiments, the electronic device 2 can comprise the above-mentioned substrate structure 1a, or any modification or variation thereof. The technical features thereof can refer to the above embodiments, so the detailed description thereof will be omitted.

The electric structures 3 are distributed on the substrate structure 1. In this embodiment, the electric structures 3 are, for example, a plurality of photoelectric structures distributed on the first surface S1 of the substrate body 111 of the substrate structure 1. The electric structures 3 are electrically connected to the first conductive pads 112a or/and the first conductive circuit (e.g. the signal lines L1 or L2), and further electrically connected to the second conductive pads 112b or/and the second conductive circuit (not shown) via the conductive wires 12. Each photoelectric structure is electrically connected to the corresponding first conductive pad 112a via two connection pads P1 and P2 as well as the corresponding signal lines L1 and L2 (i.e. the first conductive circuit). Accordingly, each photoelectric structure can be electrically connected to the corresponding first conductive pad 112a via the connection pads P1 and P2, and further electrically connected to the corresponding second conductive pad 112b via the corresponding conductive wire 12. To be noted, the electric structures 3 of this embodiment as well as the circuit layout on the substrate structure 1 are not limited to the photoelectric structures.

In this embodiment, each photoelectric structure can comprise at least one photoelectric element. The photoelectric element can be a millimeter or micrometer photoelectric chip or photoelectric package. In some embodiments, each photoelectric element can at least include, for example but not limited to, an LED chip, a Mini LED chip, a Micro LED chip, a Micro sensor chip, or at least one package, or a photoelectric chip or package with an unlimited size such as in millimeters, micrometers or smaller. To be noted, the millimeter package can include micrometer chips. In some embodiments, each photoelectric element can include one photoelectric chip or package, so that the photoelectric element can be realized as a single pixel. In some embodiments, each photoelectric element can include multiple photoelectric chips or packages, so that it can be realized that the photoelectric element includes multiple pixels. In some embodiments, the photoelectric element can include red, blue, or green LED chips, Mini LED chips, or Micro LED chips, or other colors of LED, Mini LED, Micro LED or smaller chips or packages. When the three photoelectric chips or packages on the photoelectric element are respectively red, blue and green LED, Mini LED, or Micro LED chips, a full-color LED, Mini LED, or micro LED display can be manufactured. The above-mentioned chip may be a die with horizontal electrodes, flip-chip electrodes, or vertical electrodes, wherein the electrodes thereof can be electrically connected by wire bonding or flip-chip bonding. The aforementioned package is not limited to a package with active components or a passive package without active components. Herein, the active component can be, for example but not limited to, a thin-film transistor (TFT), a silicon IC or a non-silicon IC. In some embodiments, the electronic device 2 can further comprise one or more active devices corresponding to at least one of the above-mentioned photoelectric devices 3, and the active device can be, for example but not limited to, a thin-film transistor (TFT), a silicon IC or a non-silicon IC. In some embodiments, the electronic structure includes, for example but not limited to, an active device (or/and integrated components thereof) such as an thin-film transistors (TFT), a silicon IC or a non-silicon IC, or a passive device (or/and integrated components thereof) such as a capacitor, a resistor, an inductors, a conductor, an encoder, a potentiometer, an antenna, a transformer, a filter, an attenuator, a coupler, an oscillator, an antenna element, an RF component or a microwave (or millimeter wave) component.

Figure 5:
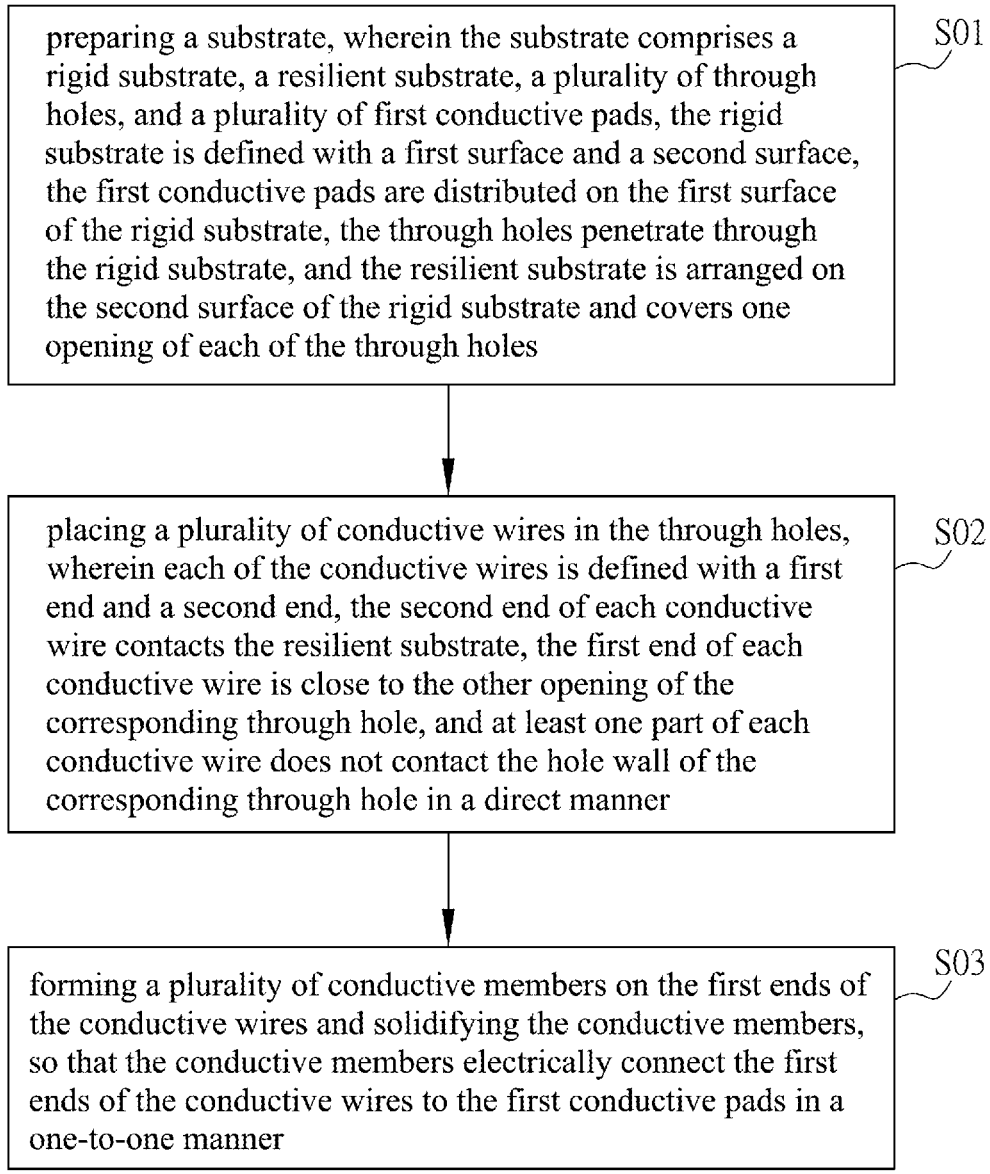
FIG. 5 is a flow chart of a manufacturing method of a substrate structure according to an embodiment of this disclosure.

FIG. 5 is a flow chart of a manufacturing method of a substrate structure according to an embodiment of this disclosure. As shown in FIG. 5, the manufacturing method of a substrate structure of this disclosure comprises the following steps of: preparing a substrate, wherein the substrate comprises a rigid substrate, a resilient substrate, a plurality of through holes, and a plurality of first conductive pads, the rigid substrate is defined with a first surface and a second surface, the first conductive pads are distributed on the first surface of the rigid substrate, the through holes penetrate through the rigid substrate, and the resilient substrate is arranged on the second surface of the rigid substrate and covers one opening of each of the through holes (step S01); placing a plurality of conductive wires in the through holes, wherein each of the conductive wires is defined with a first end and a second end opposite the first end, the second end of each conductive wire contacts the resilient substrate, the first end of each conductive wire is adjacent to the other opening of the corresponding through hole, and at least one part of each conductive wire does not contact the hole wall of the corresponding through hole in a direct manner (step S02); and forming a plurality of conductive members on the first ends of the conductive wires and curing the conductive members, so that the conductive members electrically connect the first ends of the conductive wires to the first conductive pads in a respective manner (step S03). Moreover, the manufacturing method of this disclosure further comprise to repeat the step of forming the conductive members to form additional conductive members on the second ends of the conductive wires and solidify the additional conductive members, so that the additional conductive members electrically connect the second ends of the conductive wires to the second conductive pads in a respective manner.

The steps of the above-mentioned manufacturing method will be further described with reference to FIG. 1 in view of FIGS. 6A, 6B, 7A, 7B and 8. FIGS. 6A, 6B, 7A, 7B and 8 are sectional views of the manufactured substrate structure in different manufacturing steps of this disclosure.

Figure 6A:
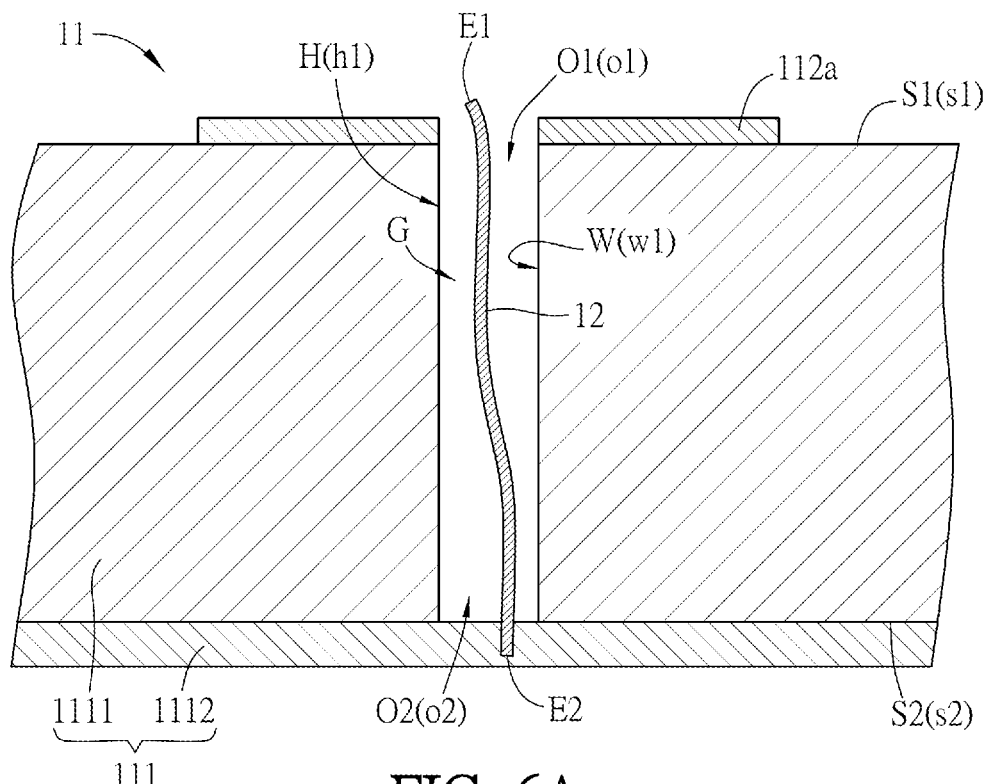
FIGS. 6A, 6B, 7A, 7B and 8 are sectional views of the manufactured substrate structure in different manufacturing steps of this disclosure.

Referring to FIG. 6A, the step S01 is to prepare a substrate 11, wherein the substrate 11 comprises a rigid substrate 1111, a resilient substrate 1112, a plurality of through holes h1, and a plurality of first conductive pads 112a, the rigid substrate 1111 is defined with a first surface s1 and a second surface s2, the first conductive pads 112a are distributed on the first surface s1 of the rigid substrate 1111, the through holes h1 penetrate through the rigid substrate 1111, and the resilient substrate 1112 is arranged on the second surface s2 of the rigid substrate 1111 and covers one opening (i.e., the second opening o2) of each of the through holes h1. In this case, the rigid substrate 1111 and the resilient substrate 1112 form the substrate body 111. In this embodiment, the resilient substrate 1112 can be an adhesive layer, which can be removed in the following process. The resilient substrate 1112 is configured to close the second openings o2 of the through holes h1 of the substrate 11, and it can be removed after placing the conductive wires 12 in the corresponding through holes h1 (the step S02) for performing the following steps. The material of the adhesive layer can comprise, for example, an adhesive material. In some embodiments, the resilient substrate 1112 can be a resilient composite layer including an adhesive layer and a PI layer or a releasing film. In some embodiments, the adhesive layer (the resilient substrate 1112) comprises a silicon series material, an acrylic series material, a resin series material, or the likes. In some embodiments, a plurality of through holes h1 can be formed on the substrate body 111 by, for example but not limited to, laser. In some embodiments, a plurality of first conductive pads 112a can be formed on the first surface s1 of the rigid substrate 1111 by, for example but not limited to, a printing or dispensing process.

Next, the step S02 is to place a plurality of conductive wires 12 in the through holes h1, wherein each of the conductive wires 12 is defined with a first end E1 and a second end E2 opposite the first end E1, the second end E2 of each conductive wire 12 contacts the resilient substrate 1112, the first end E1 of each conductive wire 12 is adjacent to the other opening (i.e., the first opening o1) of the corresponding through hole h1, and at least one part of each conductive wire 12 does not contact the hole wall w1 of the corresponding through hole h1 in a direct manner. In this step, the conductive wire 12 enters the corresponding through hole h1 through the first opening o1 of the through hole h1. In some embodiments, one conductive wire 12 (or more) is placed in one corresponding through hole h1. In some embodiments, the step of placing the conductive wires 12 further comprises: placing the conductive wires 12 in multiple through holes h1 at the same time. In other words, in the step of placing the conductive wires 12, a plurality of through holes h1 can be configured with one conductive wire 12 (or more) at the same time. Of course, a plurality of through holes h1 can be configured with one conductive wire 12 (or more) separately. This disclosure is not limited thereto.

Before or after the step S02 of placing a plurality of conductive wires 12 in the through holes h1, with reference to FIG. 1, the manufacturing method further comprises: forming a first conductive circuit (the signal lines L1 and L2) on the first surface s1 of the rigid substrate 1111, wherein the first conductive pads 112a are electrically connected to the first conductive circuit (the signal lines L1 and L2). Herein, the first conductive circuit (the signal lines L1 and L2) can be formed by printing or dispensing. To be noted, if the first conductive circuit is formed after the step of placing the conductive wires 12, the protruded conductive members 13 should be planarized before forming the first conductive circuit. This additional step can decrease the interference in the following processes, thereby increasing the process accuracy.

Figure 6B:
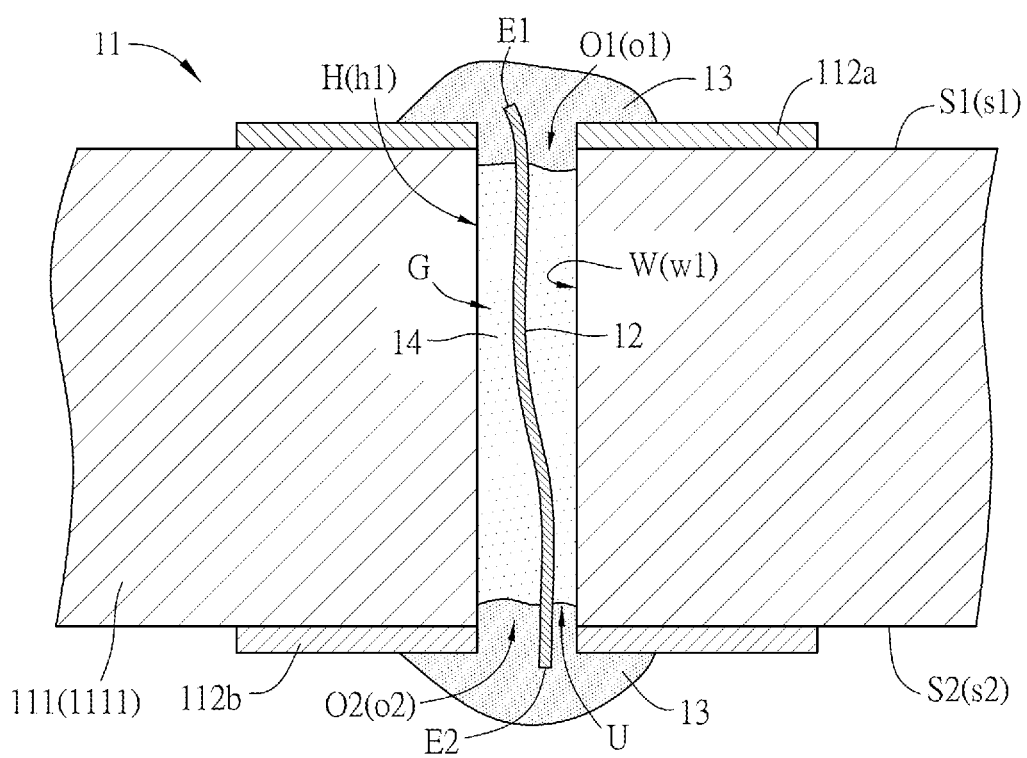

Referring to FIG. 6B, before or after the step S02 of placing a plurality of conductive wires 12 in the through holes h1, the manufacturing method further comprises: removing the resilient substrate 1112 (the adhesive layer) to expose the second openings o2 of the through holes h1; and forming a plurality of second conductive pads 112b on the second surface s2 of the rigid substrate 1111, wherein the second conductive pads 112b are adjacent to the second openings o2 of the through holes h1. In some embodiments, the resilient substrate 1112 can be removed by mechanical stress removal, tearing, or dissociation removal, or it can be removed after reducing the adhesion thereof. In some embodiments, the resilient substrate 1112 can be a dissociation material. In some embodiments, the resilient substrate 1112 can be irradiated by UV light or treated by temperature process (heating or cooling), and then be removed. In addition, the second conductive pads 112b can also be formed by, for example, printing or dispensing process. Since the resilient substrate 1112 of this embodiment can be removed, the first surface s1 and the second surface s2 of the rigid substrate 1111 of the substrate 11 are equivalent to the first surface S1 and the second surface S2 of the substrate body 111 as shown in FIGS. 2A to 2C, the through holes h1 of the rigid substrate 1111 are equivalent to the through holes H of the substrate 11 as shown in FIGS. 2A to 2C, the first openings of and the second openings o2 of the through holes h1 are equivalent to the first openings O1 and the second openings O2 of the through holes H as shown in FIGS. 2A to 2C, and the hole walls w1 of the through holes h1 are equivalent to the hole walls W of the through holes H as shown in FIGS. 2A to 2C.

In addition, before or after the step S02 of placing a plurality of conductive wires 12 in the through holes h1, the manufacturing method further comprises: forming a second conductive circuit on the second surface s2 of the rigid substrate 1111 (the substrate body 111), wherein the second conductive pads 112b are electrically connected to the second conductive circuit. Herein, the second conductive circuit can also be formed by, for example, printing or dispensing.

After the step S02 of placing the conductive wires 12 and before the step S03 of forming the conductive members 13, as shown in FIG. 6B, a plurality of organic materials 14 can be filled in the through holes h1. In some embodiments, the organic materials are fluid materials, which can be filled in the through holes h1 through the first openings o1 of the through holes h1. To be noted, the order of the step of filling the organic materials 14 and the step of placing the conductive wires 12 is not limited. With considering the viscosity of the organic materials 14 or the process adjustment, the step of filling the organic materials 14 can be performed after the step of placing the conductive wires 12 and before the step of forming the conductive members 13, or the step of filling the organic materials 14 can be performed before the step of placing the conductive wires 12. This disclosure is not limited thereto. In this embodiment, the step of filling the organic materials 14 is performed after the step S02 of placing the conductive wires 12. In some embodiments, the organic materials 14 comprise a silicon series material, an acrylic series material, or a resin series material. In some embodiments, the organic materials 14 can be solidified at the room temperature or at a specific temperature, or be cured by UV light. The solidification or curing process is optionally depending on the material and characteristics of the organic materials 14.

Afterwards, the step S03 is to form a plurality of conductive members 13 on the first ends E1 of the conductive wires 12 and curing the conductive members 13, so that the conductive members 13 electrically connect the first ends E1 of the conductive wires 12 to the first conductive pads 112a in a respective manner. In some embodiments, the conductive members 13 can be formed by dispensing or printing, so that the second ends E2 of the conductive wires 12 can be electrically connected to the second conductive pads 112b via the conductive members 13. In some embodiments, the solidification process can be performed by heating, pressing, a combination thereof, or any of other methods. In some embodiments, in the step S03 of forming a plurality of conductive members 13, the first conductive circuit (the signal lines L1 and L2) or/and the second conductive circuit can be formed at the same time. In some embodiments, when the first conductive circuit (the signal lines L1 and L2) and the conductive members 13 are formed in the same process, the material of the conductive member 13 may sink toward the middle part of the corresponding through hole H, but this does not affect the electric connection. In some embodiments, the electric connections between the conductive members 13, the conductive wires 12, the first conductive pads 112a and the second conductive pads 112b can be implemented by eutectic connection of the above-mentioned metals, any combination of the above-mentioned metals, the alloy of any combination of the above-mentioned metals.

In some embodiments, in the step S03 of forming a plurality of conductive members 13, at least one conductive member 13 (the fluid material before solidification) can extends from the first end E1 of the corresponding conductive wire 12 to the second end E2 of the corresponding conductive wire 12, wherein the conductive member 13 connects to the corresponding first conductive pad 112a at the first end E1 of the conductive wire 12, and connects to the corresponding second conductive pad 112b at the second end E2 of the conductive wire 12. In this case, at least one part of each conductive wire 12 still does not contact the hole wall w1 of the corresponding through hole h1 in a direct manner.

Referring to FIG. 6B, the manufacturing method of this embodiment further comprises: repeating the step of forming a plurality of conductive members 13 to form additional conductive members 13 on the second ends E2 of the conductive wires 12 and solidify the additional conductive members 13, so that the additional conductive members 13 electrically connect the second ends E2 of the conductive wires 12 to the second conductive pads 112b in a respective manner. Accordingly, the additional conductive members 13 can electrically connect to the second conductive circuit. In some embodiments, the additional conductive members 13 can be formed by dispensing or printing, so that the second end E2 of the conductive wire 12 can be electrically connected to the corresponding second conductive pad 112b as well as the second conductive circuit via the additional conductive member 13. In some embodiments, when repeating the step of forming a plurality of conductive members 13, the second conductive circuit can be formed at the same time. To be noted, before repeating the step of forming a plurality of conductive members 13, the semi-finished product of the substrate structure 1 can be inverted first, so that the positions of the first surface S1 and the second surface S2 of the substrate 11 are switched.

Before repeating the step of forming a plurality of conductive members 13, if it is required to fully fill the gaps G in the through holes h1, the manufacturing method further comprises to repeat the step of filling the organic materials 14 in the through holes h1 to fill additional organic materials 14 in the through holes h1. Accordingly, additional materials 14 (the same or different organic materials) can be filled into the through holes h1 via the second opening o1 of each through hole h1. This this process, the viscosity of the additional organic materials 14 used in this repeated filling step can be lower than the viscosity of the previously filled organic materials 14. Theoretically, if the viscosity of the organic materials 14 used in the repeated filling step is lower (i.e., better fluidity), it can fill the remained pores formed after the first filling step, thereby filling the entire gaps G in the through holes h1 with the organic materials 14 as much as possible (e.g., fully filling).

Figure 7A:
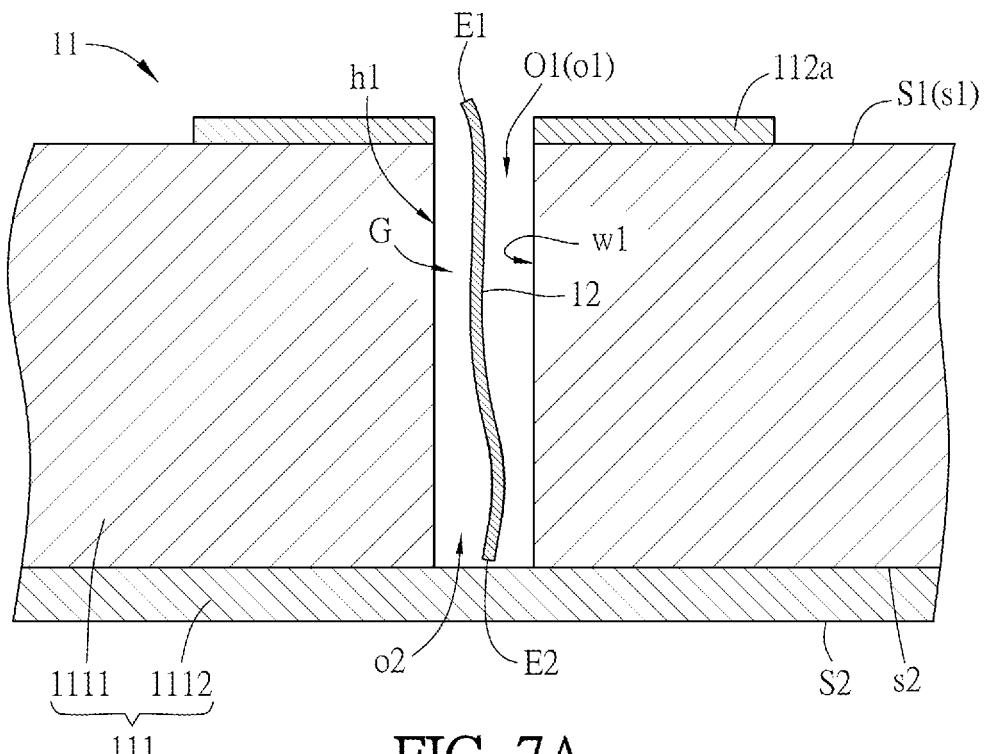
Figure 7B:
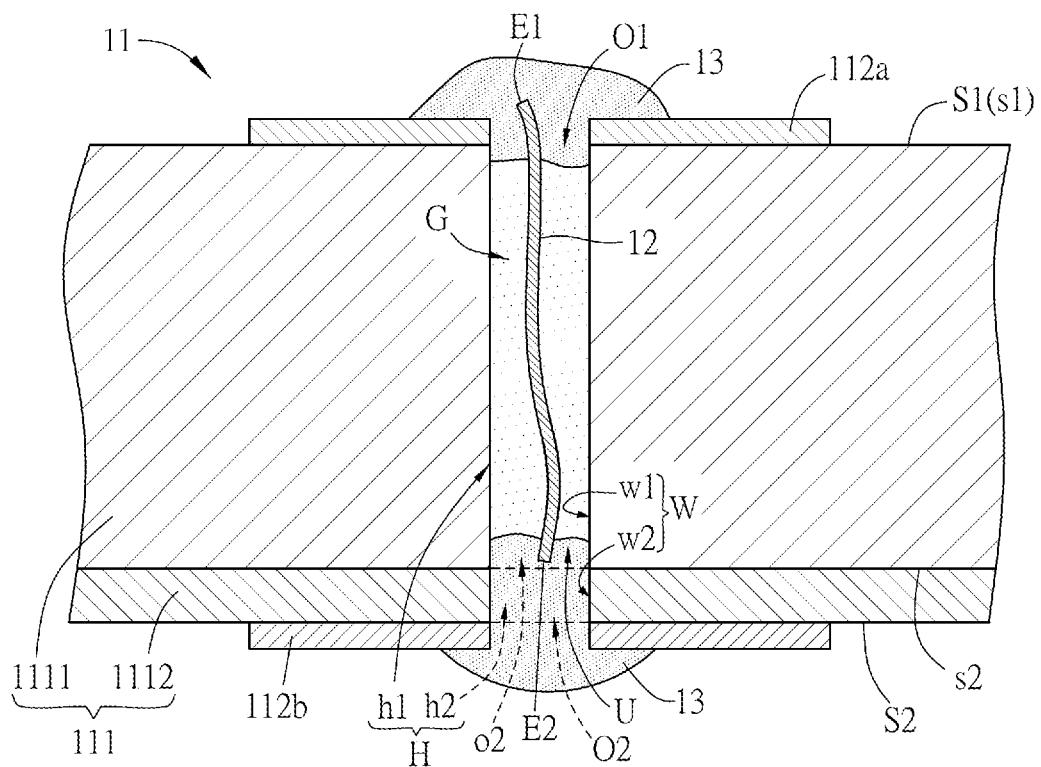

As shown in FIGS. 7A and 7B, the manufacturing processes of the substrate structure of this embodiment are mostly the same as those of the previous embodiment. Unlike the previous embodiment, the resilient substrate 1112 of the substrate structure 11 of this embodiment is not an adhesive layer but a flexible substrate (not to be removed) remained on the second surface s2 of the rigid substrate 1111. The material of the flexible substrate (the resilient substrate 1112) can be, for example but not limited to, PI.

In addition, before or after the step S02 of placing a plurality of conductive wires 12 in the through holes h1, the manufacturing method further comprises: forming a plurality of second conductive pads 112b on a surface of the resilient substrate 1112 away from (the second surface s2 of) the rigid substrate 1111. In addition, before or after the step S02 of placing a plurality of conductive wires 12 in the through holes h1, the manufacturing method further comprises: forming a second conductive circuit on a surface of the resilient substrate 1112 away from (the second surface s2 of) the rigid substrate 1111, wherein the second conductive pads 112b are electrically connected to the second conductive circuit. In some embodiments, the second conductive circuit can be formed in the step S03 of forming a plurality of conductive members 13.

In order to electrically connect the conductive members 13 to the corresponding second ends E2 of the conductive wires 12, after the step S02 of placing a plurality of conductive wires 12 in the through holes h1, the manufacturing method of this embodiment further comprises: forming a plurality of outer holes h2 on the resilient substrate 1112, wherein each of the outer holes h2 communicates with the corresponding through hole h1 of the rigid substrate 1111, and the second conductive pads 112b are adjacent to the outer holes h2. In this embodiment, the diameter of the outer holes h2 is equal to that of the through holes h1. In different embodiments, the diameter of the outer holes h2 can be different from that of the through holes h1 (to be described in the following embodiment).

To be understood, since the resilient substrate 1112 of this embodiment is not removed, the surface of the resilient substrate 1112 away from the second surface s2 of the rigid substrate 1111 is equivalent to the first surface S1 or the second surface S2 of the substrate body 111 as shown in FIGS. 2A to 2C. The through holes h1 of the rigid substrate 1111 and the outer holes h2 of the resilient substrate 1112 can together form the through holes H of the substrate 11 of FIGS. 2A to 2C. The first openings o1 of the through holes h1 are equivalent to the first openings O1 of the through holes H of FIGS. 2A to 2C, and the openings of the outer holes h2 away from the second surface s2 of the rigid substrate 1111 are equivalent to the second openings O2 of the through holes H of FIGS. 2A to 2C. The hole walls w1 of the through holes h1 and the hole walls w2 of the resilient substrate 1112 can together form the hole walls W of the through holes H of FIGS. 2A to 2C.

To be understood, in some embodiments, the resilient substrate 1112 can further comprise an adhesive layer (not shown) in addition to the flexible substrate, and the adhesive layer can be comprehensively or locally, permanently or temporarily fixed to the rigid substrate 1111, such as the above-mentioned resilient composite layer. In this embodiment, the resilient substrate 1112 (including the flexible substrate and the adhesive layer) can be remained (not removed) and subjected to a forming process, and this disclosure is not limited thereto.

Figure 8:
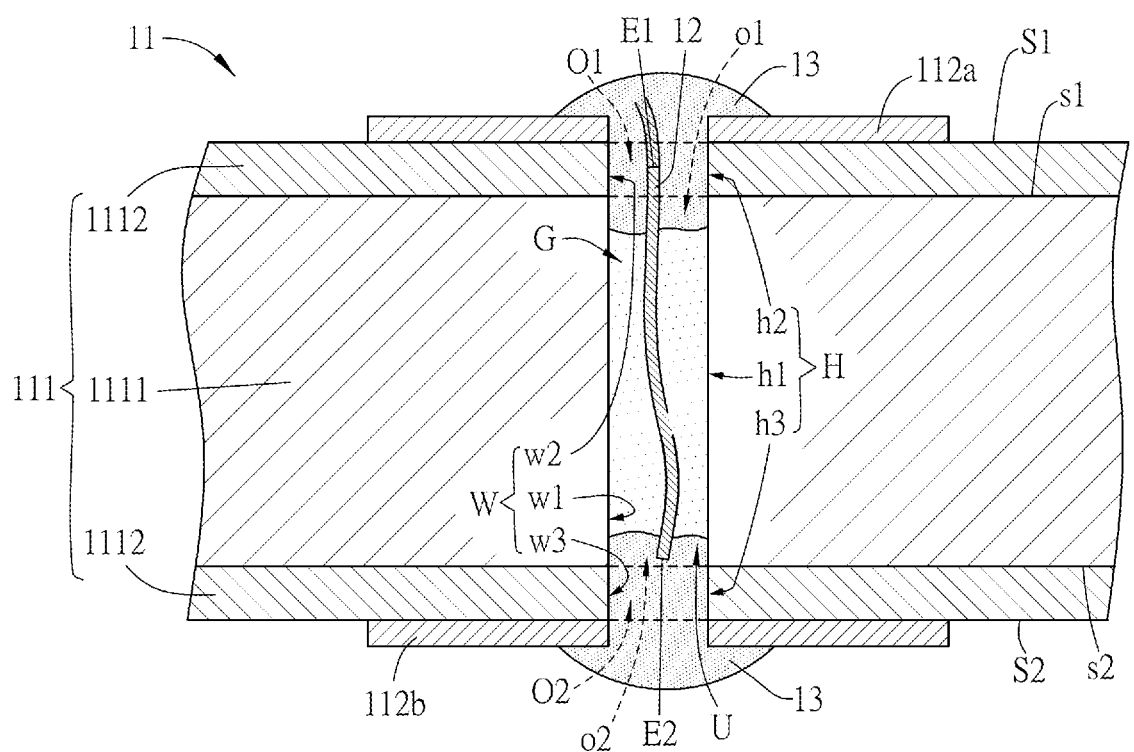

As shown in FIG. 8, the manufacturing process of the substrate structure of this embodiment is mostly the same as that of the previous embodiment. Unlike the previous embodiment, in the step S01 of preparing the substrate 11, the substrate structure 11 comprises two resilient substrates 1112, which are both flexible substrates. The two resilient substrates 1112 are arranged on the first surface s1 and the second surface s2 of the rigid substrate 1111 respectively, and enclose the two openings of and o2 of each of the through holes h1 (the dotted lines of the resilient substrate 1112 as shown in FIG. 8). In addition, in order to electrically connect the conductive member 13 to the first end E1 of the corresponding conductive wire 12, the manufacturing method of this embodiment further comprises: forming a plurality of first outer holes h2 on the resilient substrate 1112 arranged on the first surface s1 of the rigid substrate 1111 and forming a plurality of first conductive pads 112a on this resilient substrate 1112, wherein each of the first outer holes h2 communicates with the corresponding through hole h1, and the first conductive pads 112a correspond to the first outer holes h2 (for example, in a respective manner). Herein, for example, the diameter of the first outer hole h2 is equal to the diameter of the through hole h1. Of course, in different embodiments, the diameter of the first outer hole h2 can be different from the diameter of the through hole h1. Since the resilient substrate 1112 arranged on the upper side of the rigid substrate 1111 is configured with the first outer holes h2, the step S03 of forming a plurality of conductive members 13 can electrically connect the conductive member 13 to the first end E1 of the corresponding conductive wire 12 via the first outer hole h2.

Before or after the step S02 of placing a plurality of conductive wires 12 in the through holes h1, the manufacturing method further comprises: forming a first conductive circuit (the signal lines L1 and L2) on a surface of the resilient substrate 1112 away from (the first surface s1 of) the rigid substrate 1111, wherein the first conductive pads 112a are electrically connected to the first conductive circuit (the signal lines L1 and L2). In addition, before or after the step S02 of placing a plurality of conductive wires 12 in the through holes h1, the manufacturing method further comprises: forming a plurality of second conductive pads 112b on a surface of the resilient substrate 1112 away from (the second surface s2 of) the rigid substrate 1111. Moreover, before or after the step S02 of placing a plurality of conductive wires 12 in the through holes h1, the manufacturing method further comprises: forming a second conductive circuit on a surface of the resilient substrate 1112 away from (the second surface s2 of) the rigid substrate 1111, wherein the second conductive pads 112b are electrically connected to the second conductive circuit. In this embodiment, the second conductive circuit is formed on the surface of the resilient substrate 1112, which is arranged on the second surface s2 of the rigid substrate 1111, away from the rigid substrate 1111, and the second conductive pads 112b are electrically connected to the second conductive circuit. Herein, the step of forming the second conductive circuit and the step S03 of forming a plurality of conductive members 13 can be performed at the same time.

In order to electrically connect each of the conductive members 13 to the second end E2 of the corresponding conductive wire 12, the manufacturing method of this embodiment further comprises: forming a plurality of second outer holes h3 on the resilient substrate 1112 arranged on the second surface s2 of the rigid substrate 1111 and forming a plurality of second conductive pads 112b on this resilient substrate 1112, wherein each of the second outer holes h3 communicates with the corresponding through hole h1, and the second conductive pads 112b correspond to the second outer holes h3. Herein, for example, the diameter of the second outer hole h3 is equal to the diameter of the through hole h1. Of course, in different embodiments, the diameter of the second outer hole h3 can be different from the diameter of the through hole h1. Since the resilient substrate 1112 arranged at the lower side of the rigid substrate 1111 is configured with the second outer holes h3, the repeated step of forming a plurality of conductive members 13 can electrically connect the conductive member 13 to the second end E2 of the corresponding conductive wire 12 via the second outer hole h3.

In this embodiment, the resilient substrate 1112 can further comprise a comprehensive or partial, temporary or permanent adhesive layer (not shown) in addition to the flexible substrate. The other technical contents of the manufacturing method of a substrate structure of this embodiment can refer to the above descriptions, so the details thereof will be omitted.

To be understood, since the two resilient substrates 1112 of this embodiment is not removed, the surface of the upper resilient substrate 1112 away from the first surface s1 of the rigid substrate 1111 and the surface of the lower resilient substrate 1112 away from the second surface s2 of the rigid substrate 1111 are equivalent to the first surface S1 and the second surface S2 of the substrate body 111 as shown in FIGS. 2A to 2C. The through holes h1 of the rigid substrate 1111, the first outer holes h2 of the upper resilient substrate 1112 and the second outer holes h3 of the lower resilient substrate 1112 can together form the through holes H of the substrate 11 of FIGS. 2A to 2C. The openings of the first outer holes h2 away from the first surface s1 of the rigid substrate 1111 are equivalent to the first openings O1 of the through holes H of FIGS. 2A to 2C, and the openings of the second outer holes h3 away from the second surface s2 of the rigid substrate 1111 are equivalent to the second openings O2 of the through holes H of FIGS. 2A to 2C. The hole walls w1 of the through holes h1, the hole walls w2 of the upper resilient substrate 1112, and the hole walls w3 of the lower resilient substrate 1112 can together form the hole walls W of the through holes H of FIGS. 2A to 2C.

In some embodiments, the step S03 of forming a plurality of conductive members 13 can be substituted by applying heat (e.g., laser energy) to the first ends E1 of the conductive wires 12, so that the first ends E1 of the conductive wires 12 can be melted and connected to the corresponding first conductive pads 112a. In this case, the first end E1 of each conductive wire 12 is eutectic bonding to the corresponding first conductive pad 112a. In some embodiments, the repeating step of forming a plurality of conductive members 13 can also be substituted by applying heat (e.g., laser energy) to the second ends E2 of the conductive wires 12, so that the second ends E2 of the conductive wires 12 can be melted and connected to the corresponding second conductive pads 112b. In this case, the second end E2 of each conductive wire 12 is eutectic bonding to the corresponding second conductive pad 112b. To be understood, either one or both of the first end E1 and the second end E2 of each conductive wire 12 can be subjected to the step of applying a heat to form the eutectic bonding.

In some embodiments, in the case of substituting the step S03 of forming a plurality of conductive members 13 by applying heat, when placing a plurality of conductive wires 12 in the through holes H, the second ends E2 of the conductive wires 12 are adjacent to the second openings O2 of the corresponding through holes H and are not connected to any of other components (e.g., suspended), this step is to apply heat to the first ends E1 of the conductive wires 12 to eutectic bond the first end E1 of the conductive wire 12 to the corresponding first conductive pad 112a. To be understood, as shown in FIGS. 5, 6A and 6B, the step S01 of preparing the substrate 11 can selectively provide without the resilient substrate 1112 (serve as the adhesive layer). In this case, the step of removing the resilient substrate 1112 (the adhesive layer) is not needed. To be understood, the conductive wire 12 in some embodiments may be a wire segment that has been cut. In some embodiments, the conductive wire 12 can be a part of the original conductive wire material and has not been separated (cut) until the first end E1 of the conductive wire 12 is applied with laser. It should be understood that, in some embodiments, the step of filling a plurality of organic materials 14 in the through holes H can also be selectively omitted.

As mentioned above, in the substrate structure 1 (or 1a) and the manufacturing method thereof, and the electronic device 2 of the above embodiment, the conductive wires 12 are arranged in the through holes H of the substrate 11, the first end E1 of each conductive wire 12 is electrically connected to the corresponding first conductive pad 112a through one of the conductive members 13, and the second end E2 of each conductive wire 12 is electrically connected to the corresponding second conductive pad 112b through the same one or another one of the conductive members 13. In the case of utilizing the same conductive member 13, the conductive member 13 extends from the first end E1 to the second end E2 along the corresponding conductive wire 12. Accordingly, the two ends (E1 and E2) of the conductive wire 12 can electrically connect to the first conductive pad 112a and the second conductive pad 112b, respectively, through the corresponding conductive member(s) 13. Therefore, the first conductive circuit (the signal lines L1 and L2) formed on the first surface S1 of the substrate body 111 (or the first surface s1 of the rigid substrate 1111) can electrically connect to the second conductive circuit formed on the second surface S2 of the substrate body 111 via the first conductive pad 112a, the conductive member 13, the conductive wire 12, and the second conductive pad 112b. Compared to the conventional manufacturing process of forming the conductive film by chemical plating or electroplating process to electrically connect the circuit layers on the upper and lower surfaces of the substrate, the substrate structure 1 (or 1a) and the manufacturing method thereof, and the electronic device 2 of this disclosure have the advantages of simplified manufacturing process, lower manufacturing cost, and environmentally friendly.

Figure 9:
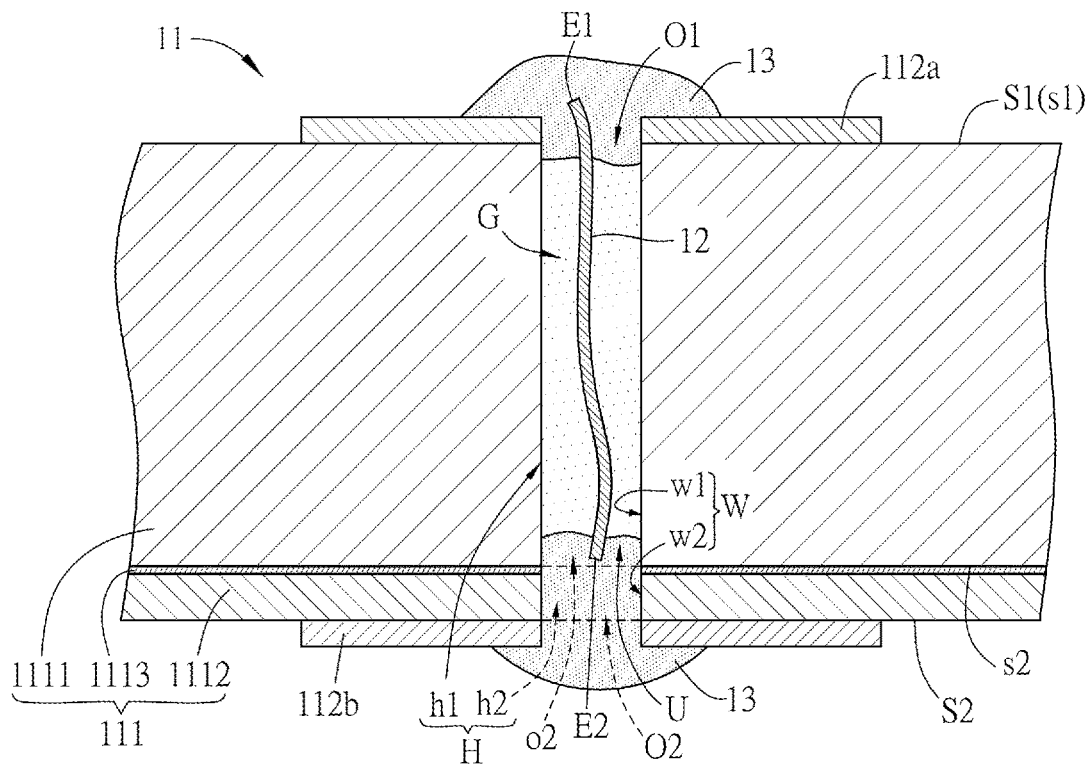
FIGS. 9 and 10 are sectional views of the substrate structures according to different embodiments of this disclosure.

In some embodiments, the substrate body 111 is configured with a conductive pattern layer 1113. Herein, the substrate body 111 is configured with at least one base layer or multiple base layers, and the conductive pattern layer 1113 is penetrated by at least one through hole H and electrically connected to one of the conductive members corresponding to the said through hole H. As shown in FIG. 9, the conductive pattern layer 1113 is electrically connected the conductive member 13 located at the first opening O1 (or the second opening O2) to the corresponding first conductive pad 112a (and the second conductive pad 112b). The manufacturing process of the substrate structure of this embodiment is mostly the same as that shown in FIG. 7B. Unlike the previous embodiment, in the substrate structure 11 of this embodiment, at least one conductive pattern layer 1113 is arranged between the resilient substrate 1112 and the rigid substrate 1111. This conductive pattern layer 1113 can be a conductive layer preformed on the resilient substrate 1112 or the rigid substrate 1111, and then the resilient substrate 1112 and the rigid substrate 1111 are attached to each other. In another case, both of the resilient substrate 1112 and the rigid substrate 1111 are each preformed with a conductive layer, and then the resilient substrate 1112 and the rigid substrate 1111 are attached to each other. Accordingly, at least one conductive pattern layer 1113 can be arranged between the resilient substrate 1112 and the rigid substrate 1111. In this embodiment, the conductive pattern layer 1113 is electrically connected to the conductive member 13 located at the second opening O2, and then further electrically connected to the corresponding first conductive pad 112a and the corresponding second conductive pad 112b. To be noted, the conductive pattern layer 1113 of this disclosure can be adjacent to either the first opening O1 or the second opening O2 without limitation. In addition, the aspect of this embodiment can be applied to other embodiments of this disclosure. To be understood, the substrate body 111 can comprise one single conductive pattern layer 1113 or multiple conductive pattern layers 1113, and the conductive pattern layer(s) 1113 can substitute the conductive circuit(s) of the first surface S1 or/and the second surface S2 of the substrate body 111.

Figure 10:
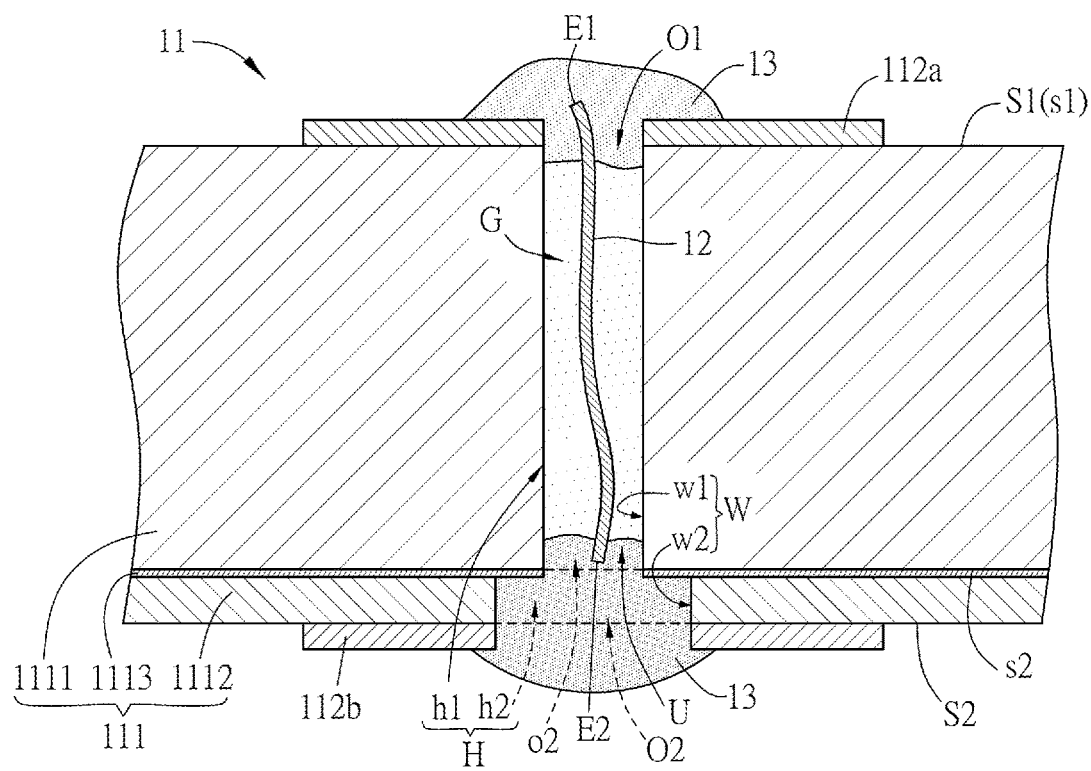

In some embodiments, the conductive member 13 located at the first opening O1 or the second opening O2 can be electrically connected to the first conductive pad 112a or the second conductive pad 112b, the conductive pattern layer 1113, and the conductive wire 12 in a stair-like connection as shown in FIG. 10. The manufacturing process of the substrate structure of this embodiment are mostly the same as that of the FIG. 9. Unlike the previous embodiment, in the substrate structure 11 of this embodiment, the conductive pattern layer 1113 is located between the two substrates (1111 and 1112), and the diameter of the first outer hole h2 of the resilient substrate 1112 adjacent to the first opening O1 is greater than the diameter of the through hole h1 of the rigid substrate 1111 away from the first opening O1. Accordingly, a part of the conductive pattern layer 1113 can be exposed from the rigid substrate 1111, so that the conductive member 13 can be electrically connected to the second conductive pad 112b, the conductive pattern layer 1113, and the conductive wire 12 in a stair-like connection, and then further electrically connected to the first conductive pad 112a. As mentioned above, the conductive pattern layer 1113 of this disclosure can be adjacent to either the first opening O1 or the second opening O2 without limitation. In addition, the aspect of this embodiment can be applied to other embodiments of this disclosure.

In this disclosure, the conductive wires are implanted into the corresponding through holes. This technology can be applied to the substrate structure with larger difference between the hole depth and hole diameter (higher depth-to-diameter ratio), thereby decreasing the risk of electrical connection failures while applying chemical plating or electroplating process to the hole with small hole diameter. In addition, the substrate structure of this disclosure can be provided with or without the conductive circuit(s). For example, when being provided with the conductive circuit(s), the manufactured electronic device can be a final product; otherwise, when being provided without the conductive circuit, the manufactured electronic device should be transferred to and electrically connected to an additional circuit board or final product. This disclosure can be applied to broader applications.

As mentioned above, in the substrate structure and the manufacturing method thereof, and the electronic device of this disclosure, the conductive wires are arranged in the through holes of the substrate, the first ends of the conductive wires are electrically connected to the first conductive pads through some of the conductive members, and the second ends of the conductive wires are electrically connected to the second conductive pads through the same or different conductive members. In the case of utilizing different conductive members, the first end and the second end of each conductive wire are electrically connected to the first conductive pad and the second conductive pad, respectively, through different conductive members. In the case of utilizing the same conductive member, the conductive member extends from the first end to the second end along the corresponding conductive wire, and electrically connects to the first conductive pad and the second conductive pad. Accordingly, the first conductive pad located at the upper side of the substrate body can be electrically connected to the second conductive pad located at the lower side of the substrate body through the corresponding conductive wire and the corresponding conductive member(s), thereby forming a circuit. Furthermore, the first conductive circuit (the signal lines) on the first surface of the substrate body can be electrically connected to the second conductive circuit on the second surface of the substrate body through the formed circuit. Compared to the conventional manufacturing process of forming the conductive film by chemical plating or electroplating process to electrically connect the circuit layers on the upper and lower surfaces of the substrate, this disclosure has the advantages of simplified manufacturing process, lower manufacturing cost, and environmentally friendly, and the manufactured product thereof also has the advantages of having broader applications and decreasing the failure rate of electrical connections.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A substrate structure, comprising:
   a substrate having a substrate body, a plurality of through holes, a plurality of first conductive pads, and a plurality of second conductive pads, wherein the substrate body is defined with a first surface and a second surface opposite to each other, the through holes penetrate through the substrate body, each of the through holes is defined with a first opening and a second opening opposite to each other, and a hole wall, the first conductive pads are distributed on the first surface of the substrate body and adjacent to the first openings of the through holes, and the second conductive pads are distributed on the second surface of the substrate body and adjacent to the second openings of the through holes;
   a plurality of conductive wires arranged in the through holes, wherein each of the conductive wires extends from the first opening to the second opening of the corresponding through hole, each of the conductive wires is defined with a first end and a second end, the first end of the conductive wire is located at the first opening of the corresponding through hole, and the second end of the conductive wire is located at the second opening of the corresponding through hole;
   a plurality of conductive members distributed on the first surface and the second surface of the substrate body, wherein the first end of each of the conductive wires is electrically connected to the corresponding first conductive pad through one of the conductive members, and the second end of each of the conductive wires is electrically connected to the corresponding second conductive pad through one of the conductive members; and
   a plurality of organic materials;
   wherein, at least one part of each of the conductive wires does not contact the hole wall of the corresponding through hole in a direct manner, each of the through holes is defined with a gap between the hole wall and the corresponding conductive wire, each of the organic materials is filled in each of the gaps, and each of the organic materials connects the corresponding conductive wire and the corresponding hole wall.

2. The substrate structure of claim 1, wherein the at least one part of each of the conductive wires does not contact the corresponding conductive member in a direct manner.

3. The substrate structure of claim 1, further defined with a plurality of concave spaces;
   wherein, two ends of each of the organic materials approach the first opening and the second opening of the corresponding through hole, one of the ends of each of the organic materials, the corresponding hole wall, and one of the corresponding first opening and the corresponding second opening together form the corresponding concave space, and at least one part of each of the conductive members is located in the corresponding concave space.

4. The substrate structure of claim 1, further defined with a plurality of concave spaces;
   wherein, the concave spaces are defined between the hole walls and the corresponding first openings, and between the hole walls and the corresponding second openings, and at least one part of each of the conductive members is located in the corresponding concave space.

5. The substrate structure of claim 1, wherein the first end of each of the conductive wires is electrically connected to the corresponding first conductive pad through one of the conductive members, and the second end of each of the conductive wires is electrically connected to the corresponding second conductive pad through another one of the conductive members.

6. The substrate structure of claim 1, wherein at least one of the conductive members extends from the first end to the second end of the corresponding conductive wire.

7. The substrate structure of claim 1, wherein each of the conductive members covers at least one part of the first opening and the second opening of the corresponding through hole.

8. The substrate structure of claim 1, wherein each of the through holes is defined with a depth-to-diameter ratio, and a value of the depth-to-diameter ratio is greater than or equal to 0.5 and is less than or equal to 75.

9. The substrate structure of claim 1, wherein the substrate body is defined with a thickness, and the thickness is greater than or equal to 0.01 mm and is less than or equal to 1.1 mm.

10. The substrate structure of claim 1, wherein each of the through holes is defined with a diameter, and the diameter of the through hole is greater than or equal to 0.015 mm.

11. The substrate structure of claim 1, wherein each of the conductive wires is defined with a diameter, and the diameter of the conductive wire is greater than or equal to 0.01 mm.

12. The substrate structure of claim 1, wherein each of the conductive wires is defined with a diameter, and the diameter of the conductive wire is greater than or equal to 0.005 mm.

13. The substrate structure of claim 1, wherein the substrate body is a rigid substrate, a resilient substrate, or a combination of at least one rigid substrate and at least one resilient substrate.

14. The substrate structure of claim 13, wherein the substrate body is configured with a conductive pattern layer, at least one of the through holes penetrates through the conductive pattern layer, and the conductive pattern layer is electrically connected to one of the conductive members.

15. The substrate structure of claim 14, wherein the substrate body comprises a plurality of base layers, the conductive pattern layer is arranged between two of the base layers; and in two of the base layers, a diameter of a hole of one of the base layers adjacent to the first opening is greater than a diameter of a hole of the other one of the base layers away from the first opening, thereby exposing the conductive pattern layer.

16. The substrate structure of claim 1, wherein the first end of one of the conductive members is eutectic bonding to the corresponding first conductive pad, or/and the second end of one of the conductive members is eutectic bonding to the corresponding second conductive pad.

17. The substrate structure of claim 1, wherein the substrate further comprises a first conductive circuit, and the first conductive circuit is distributed on the first surface of the substrate body and electrically connected to the first conductive pads.

18. The substrate structure of claim 17, wherein the substrate further comprises a second conductive circuit, and the second conductive circuit is distributed on the second surface of the substrate body and electrically connected to the second conductive pads.

19. An electronic device, comprising:
the substrate structure of claim 1; and
a plurality of electric structures distributed on the first surface of the substrate body, wherein the electric structures are electrically connected to the first conductive pads, and further electrically connected to the second conductive pads via the conductive wires.

20. A substrate structure, comprising:
a substrate having a substrate body, a plurality of through holes, a plurality of first conductive pads, and a plurality of second conductive pads, wherein the substrate body is defined with a first surface and a second surface opposite to each other, the through holes penetrate through the substrate body, each of the through holes is defined with a first opening and a second opening opposite to each other, and a hole wall, the first conductive pads are distributed on the first surface of the substrate body and adjacent to the first openings of the through holes, and the second conductive pads are distributed on the second surface of the substrate body and adjacent to the second openings of the through holes;
a plurality of conductive wires arranged in the through holes, wherein each of the conductive wires extends from the first opening to the second opening of the corresponding through hole, each of the conductive wires is defined with a first end and a second end, the first end of the conductive wire is located at the first opening of the corresponding through hole, and the second end of the conductive wire is located at the second opening of the corresponding through hole; and
a plurality of conductive members distributed on the first surface and the second surface of the substrate body, wherein the first end of each of the conductive wires is electrically connected to the corresponding first conductive pad through one of the conductive members, and the second end of each of the conductive wires is electrically connected to the corresponding second conductive pad through one of the conductive members;
wherein, at least one part of each of the conductive wires does not contact the hole wall of the corresponding through hole in a direct manner, and in at least one of the through holes, the first opening and the second opening of the through hole are both entirely covered by the corresponding conductive members.

21. An electronic device, comprising:
the substrate structure of claim 20; and
a plurality of electric structures distributed on the first surface of the substrate body, wherein the electric structures are electrically connected to the first conductive pads, and further electrically connected to the second conductive pads via the conductive wires.

* * * * *